US012420316B2

(12) United States Patent
Park et al.

(10) Patent No.: US 12,420,316 B2
(45) Date of Patent: Sep. 23, 2025

(54) SUBSTRATE PROCESSING APPARATUS AND SUBSTRATE PROCESSING METHOD

(71) Applicant: Samsung Electronics Co., Ltd., Suwon-si (KR)

(72) Inventors: Sangjine Park, Suwon-si (KR); Jihwan Park, Suwon-si (KR); Kuntack Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 18/379,851

(22) Filed: Oct. 13, 2023

(65) Prior Publication Data

US 2024/0149312 A1 May 9, 2024

(30) Foreign Application Priority Data

Nov. 7, 2022 (KR) .................. 10-2022-0147384

(51) Int. Cl.
*B08B 7/00* (2006.01)
*B05B 1/18* (2006.01)
(Continued)

(52) U.S. Cl.
CPC .............. *B08B 7/0021* (2013.01); *B05B 1/18* (2013.01); *H01L 21/02101* (2013.01);
(Continued)

(58) Field of Classification Search
CPC ......... H01L 21/02101; H01L 21/67034; B08B 7/0021; B05B 1/14; B05B 1/18;
(Continued)

(56) References Cited

U.S. PATENT DOCUMENTS

| 7,513,265 B2 | 4/2009 | Yoshikawa et al. |
| 10,197,333 B2 | 2/2019 | Kim et al. |

(Continued)

FOREIGN PATENT DOCUMENTS

| CN | 106816400 B | * 7/2019 | ........... C23C 16/345 |
| KR | 101681190 B1 | 12/2016 | |

(Continued)

OTHER PUBLICATIONS

Machine Translation of KR 20220054494 to Yoon et al., May 2022. (Year: 2022).*

*Primary Examiner* — Benjamin L Osterhout
(74) *Attorney, Agent, or Firm* — Muir Patent Law, PLLC

(57) ABSTRACT

A substrate processing apparatus including a processing container including a processing space, a substrate support extending in a first direction and a second direction perpendicular to the second direction, and configured to support a substrate in the processing container, a fluid supply device configured to supply a processing fluid in a supercritical state to the processing space through a container supply pipe, and a shower head assembly configured to diffuse the processing fluid supplied from the fluid supply device into the processing space. The shower head assembly includes a first shower head having a first diameter, and a second shower head arranged between the first shower head and the substrate and having a second diameter. The processing container is separated from the shower head assembly in a third direction perpendicular to the first direction and the second direction, such that a flow path is formed between the processing container and the shower head assembly.

20 Claims, 30 Drawing Sheets

(51) Int. Cl.
- H01L 21/02 (2006.01)
- H01L 21/67 (2006.01)
- B05B 1/14 (2006.01)
- B05B 9/04 (2006.01)
- B05B 15/40 (2018.01)
- G03F 7/32 (2006.01)
- G03F 7/42 (2006.01)

(52) U.S. Cl.
CPC .......... *H01L 21/67034* (2013.01); *B05B 1/14* (2013.01); *B05B 9/0423* (2013.01); *B05B 15/40* (2018.02); *G03F 7/325* (2013.01); *G03F 7/427* (2013.01)

(58) Field of Classification Search
CPC ....... B05B 15/40; B05B 9/0423; G03F 7/427; G03F 7/325
See application file for complete search history.

(56) References Cited

U.S. PATENT DOCUMENTS

| | | |
|---|---|---|
| 10,573,510 B2 | 2/2020 | Gouk et al. |
| 10,825,698 B2 | 11/2020 | Cho et al. |
| 2006/0151115 A1* | 7/2006 | Kim ........................ G03F 7/427 |
| | | 156/345.34 |
| 2007/0020943 A1* | 1/2007 | Kim ........................... G03F 7/42 |
| | | 257/E21.256 |
| 2008/0286075 A1* | 11/2008 | Horii ........................ B08B 7/00 |
| | | 29/25.01 |
| 2010/0112806 A1* | 5/2010 | Matsumoto ....... H01L 21/76883 |
| | | 118/725 |
| 2010/0291763 A1* | 11/2010 | Ogawa .................. C23C 16/405 |
| | | 438/584 |
| 2011/0186229 A1* | 8/2011 | Hayashi .................... C23F 1/08 |
| | | 239/548 |
| 2015/0275367 A1* | 10/2015 | Moroi ................ C23C 16/4481 |
| | | 427/255.28 |
| 2016/0042925 A1 | 2/2016 | Yang |
| 2018/0076063 A1* | 3/2018 | Nakayama ............ C23C 16/345 |
| 2018/0164689 A1* | 6/2018 | Sano .................... H01L 21/6719 |
| 2021/0151300 A1* | 5/2021 | Jung ................. H01J 37/32724 |

FOREIGN PATENT DOCUMENTS

| | | | |
|---|---|---|---|
| KR | 20180037572 A | * | 4/2018 |
| KR | 1020220054494 A | | 5/2022 |
| KR | 102417011 B1 | | 7/2022 |

* cited by examiner

SUBSTRATE PROCESSING APPARATUS AND SUBSTRATE PROCESSING METHOD

CROSS-REFERENCE TO RELATED APPLICATION

This application is based on and claims priority under 35 U.S.C. § 119 to Korean Patent Application No. 10-2022-0147384, filed on Nov. 7, 2022, in the Korean Intellectual Property Office, the disclosure of which is incorporated by reference herein in its entirety.

BACKGROUND

Aspects of the inventive concept relate to a substrate processing apparatus and a substrate processing method.

According to the requirements for miniaturization of semiconductor devices, an extreme ultra-violet (EUV) lithography method having a very short wavelength (about 13.5 nm) was proposed. By using the EUV lithography, photoresist patterns having small horizontal dimensions and high aspect ratios may be formed. In order to prevent the photoresist pattern from collapsing in the process of forming a fine photoresist pattern, a technique using a supercritical fluid is being reviewed, but there are still issues to be improved, such as particle defects on a substrate during the manufacturing process of semiconductor devices.

SUMMARY

Aspects of the inventive concept provide a substrate processing apparatus and a substrate processing method that may improve substrate processing uniformity.

In addition, objects to be achieved by aspects of the inventive concept are not limited to the objects described above, and other objects may be clearly understood by those skilled in the art from descriptions below.

According to an aspect of the inventive concept, a substrate processing apparatus includes a processing container including a processing space, a substrate support extending in a first direction and a second direction perpendicular to the second direction, and configured to support a substrate in the processing container, a fluid supply device configured to supply a processing fluid in a supercritical state to the processing space through a container supply pipe, and a shower head assembly configured to diffuse the processing fluid supplied from the fluid supply device into the processing space, wherein the shower head assembly includes a first shower head having a first diameter, and a second shower head arranged between the first shower head and the substrate and having a second diameter, and wherein the processing container is separated from the shower head assembly in a third direction perpendicular to the first direction and the second direction, such that a flow path is formed between the processing container and the shower head assembly.

According to another aspect of the inventive concept, a substrate processing apparatus includes a processing container including a processing space, a substrate support extending in a first direction and a second direction perpendicular to the second direction, and configured to support a substrate in the processing container, a fluid supply device configured to supply a processing fluid in a supercritical state to the processing space through a container supply pipe, a shower head assembly configured to diffuse the processing fluid supplied from the fluid supply device into the processing space, an exhaust pipe arranged on a lower wall of the processing container, and an exhaust device configured to discharge a fluid in the processing space through the exhaust pipe, wherein the shower head assembly includes a first shower head having a first diameter and a second shower head arranged under the first shower head and having a second diameter that is greater than the first diameter, and wherein the processing container is separated from the shower head assembly in a third direction perpendicular to the first direction and the second direction to form an inclined flow path between the shower assembly and the processing container.

According to another aspect of the inventive concept, a substrate processing method includes loading a substrate into a processing space of a processing container, supplying a processing fluid in a supercritical state into the processing container through a container supply pipe provided on an upper wall of the processing container, and diffusing the supplied processing fluid into the processing space through a shower head assembly provided in the processing space, wherein the shower head assembly includes a first shower head having a first diameter and a second shower head arranged under the first shower head and having a second diameter that is greater than the first diameter.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
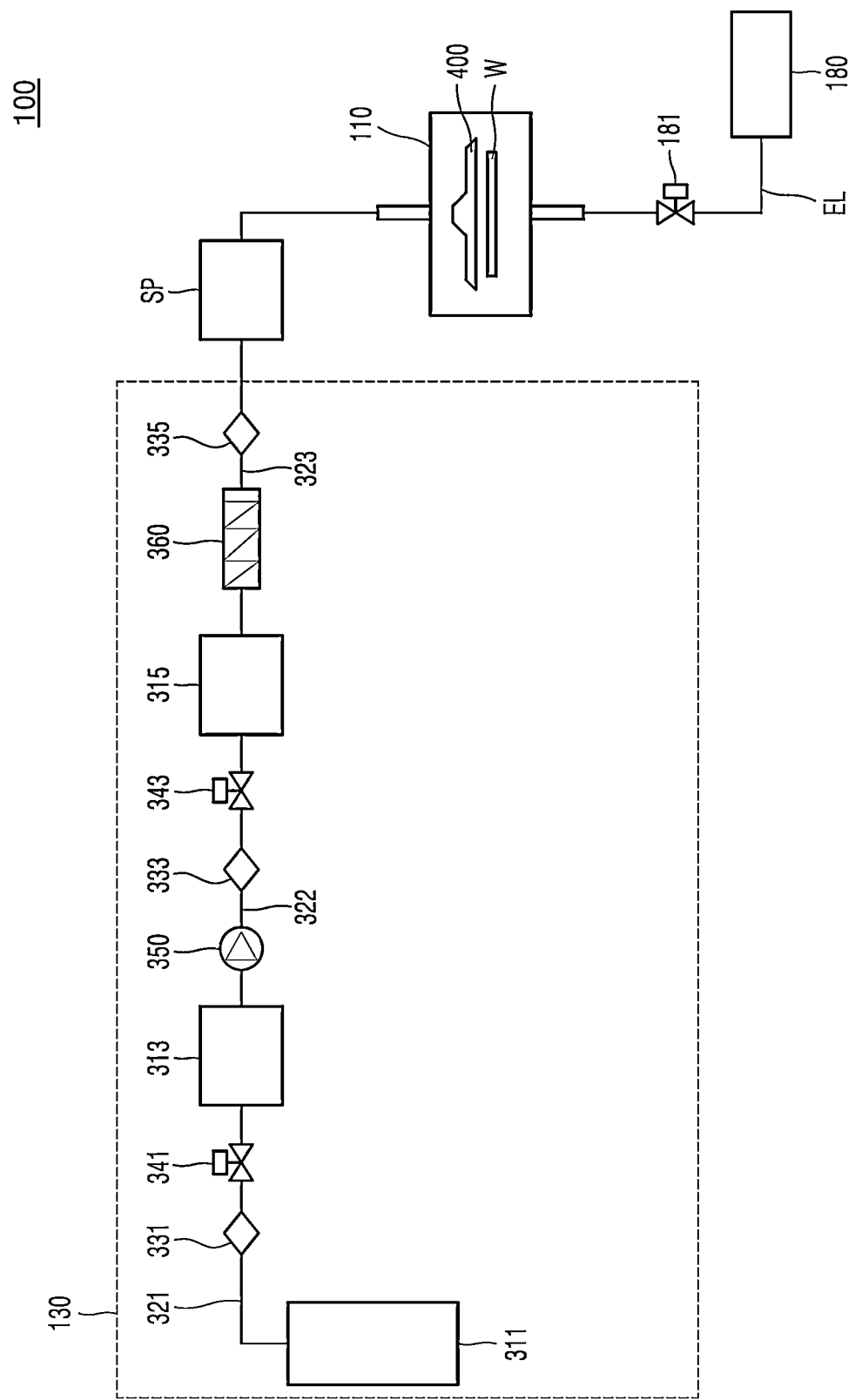
FIG. 1 is a configuration diagram illustrating a fluid supply device of a substrate processing apparatus according to an embodiment of the inventive concept.

Hereinafter, embodiments of the inventive concept are described in detail with reference to the accompanying drawings. The same reference numerals are used for the same components in the drawings, and redundant descriptions thereof are omitted.

FIG. 1 is a configuration diagram illustrating a fluid supply device 130 of a substrate processing apparatus 100 according to an embodiment of the inventive concept.

Referring to FIG. 1, the fluid supply device 130 may include a fluid supply tank 311, a condenser 313, a pump 350, a storage tank 315, and a heating device 360.

The fluid supply tank 311 may store a raw material. For example, the fluid supply tank 311 may store a processing fluid PF in a gaseous state. The condenser 313 may change a phase of the processing fluid PF. The condenser 313 may cool the processing fluid PF to be changed from a gas state to a liquid state. A filter 331 for filtering impurities in the processing fluid PF and a valve 341 for adjusting a flow of the processing fluid PF may be installed on a first fluid supply line 321 connecting the fluid supply tank 311 to the condenser 313. The first fluid supply line 321 may include, for example, a pipe.

The pump 350 may be installed on a second fluid supply line 322 extending between the condenser 313 and the storage tank 315. The pump 350 may drive the processing fluid PF such that the processing fluid PF, liquefied by the condenser 313, is supplied to the storage tank 315 through the second fluid supply line 322. A filter 333 for filtering impurities in the processing fluid PF and a valve 343 for adjusting a flow of the processing fluid PF may be installed on the second fluid supply line 322 connecting the condenser 313 to the storage tank 315. The second fluid supply line 322 may include, for example, a pipe.

The storage tank 315 may store the processing fluid PF and change a phase of the processing fluid PF to a supercritical state. The storage tank 315 may heat the processing fluid PF by using a built-in heater. The heater of the storage tank 315 may heat the processing fluid PF to a critical temperature or higher of the processing fluid PF. Accordingly, the processing fluid PF discharged from the storage tank 315 may be in a supercritical state. The processing fluid PF discharged from the storage tank 315 may flow through a third fluid supply line 323 and then flow through a supply pipe SP at one end of the third fluid supply line 323.

The heating device 360 configured to heat the processing fluid PF discharged from the storage tank 315 and a filter 335 for filtering impurities in the processing fluid PF may be installed on the third fluid supply line 323. The heating device 360 may adjust a temperature of the processing fluid PF supplied to a processing container 110 by heating the processing fluid PF moving through the third fluid supply line 323. The heating device 360 may include an electric resistance heater. The heating device 360 may include an inline heater and/or a jacket heater installed on the third fluid supply line 323.

Figure 2:
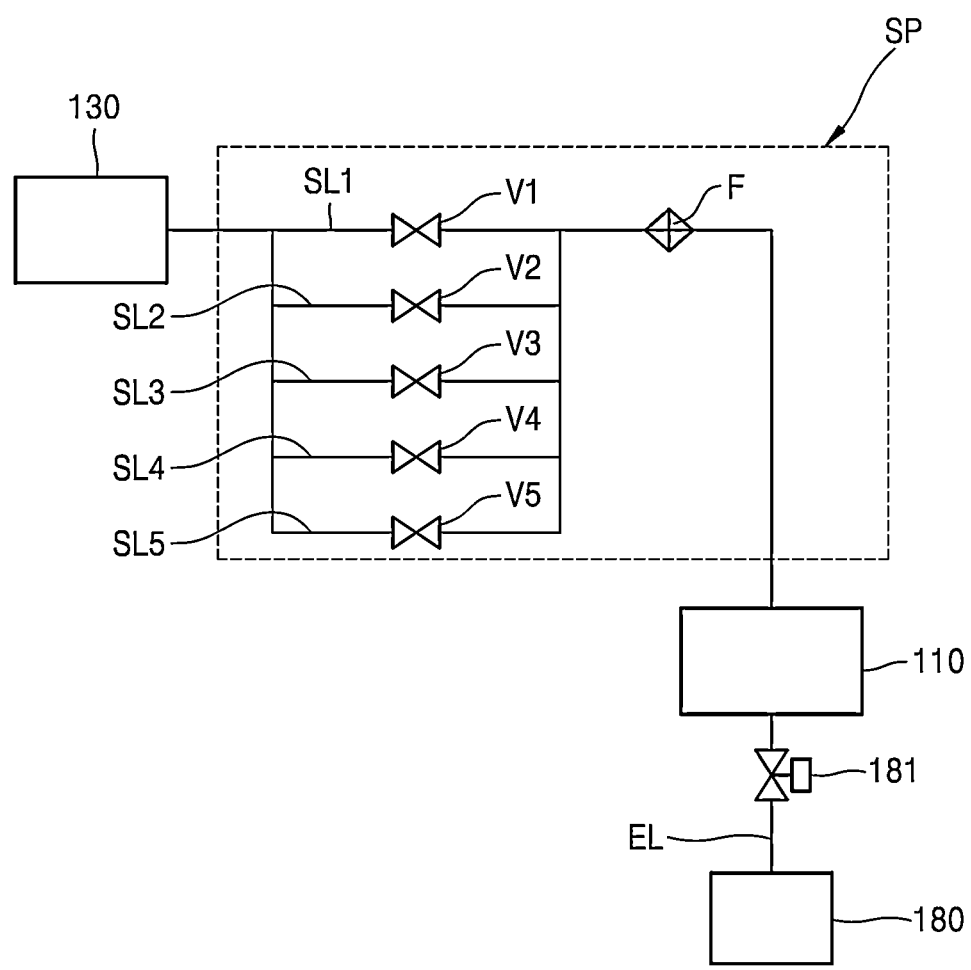
FIG. 2 is a configuration diagram illustrating a supply pipe of the substrate processing apparatus of FIG. 1.

FIG. 2 is a configuration diagram illustrating the supply pipe SP of the substrate processing apparatus 100 of FIG. 1.

Referring to FIG. 2, the supply pipe SP may connect the fluid supply device 130 to the processing container 110. The supply pipe SP may include a plurality of supply lines SL1, SL2, SL3, SL4, and SL5. The plurality of supply lines SL1, SL2, SL3, SL4, and SL5 may be classified into a first supply line SL1, a second supply line SL2, a third supply line SL3, a fourth supply line SL4, and a fifth supply line SL5. Here, the first to fifth supply lines SL1, SL2, SL3, SL4, and SL5 may be arranged in parallel. The first to fifth supply lines SL1, SL2, SL3, SL4, and SL5 may supply the processing fluid PF to an upper portion of the processing container 110.

The processing fluid PF in the first to fifth supply lines SL1, SL2, SL3, SL4, and SL5 may be heated to a preset temperature. For example, the preset temperature of the processing fluid PF may be controlled by the heating device 360 and/or a heater of the storage tank 315. In example embodiments, the preset temperature of the processing fluid PF may be between about 45° C. and about 150° C. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range A plurality of valves V1, V2, V3, V4, and V5 for adjusting a flow of the processing fluid PF may be respectively installed on the plurality of supply lines SL1, SL2, SL3, SL4, and SL5. For example, the first valve V1 for adjusting the flow of the processing fluid PF may be installed on the first supply line SL1, and the second valve V2 for adjusting the flow of the processing fluid PF may be installed on the second supply line SL2. The first to fifth supply lines SL1, SL2, SL3, SL4, and SL5 may each include, for example, a pipe.

Although FIG. 2 illustrates that the supply pipe SP of the substrate processing apparatus 100 includes five supply lines, the supply pipe SP is not limited thereto. For example, the supply pipe SP may further include three to six supply lines. In addition, although not illustrated in the drawings, a separate mass flow controller may be connected to the first to fifth supply lines SL1, SL2, SL3, SL4, and SL5. In addition, at least one filter F may be on one side of the first to fifth supply lines SL1, SL2, SL3, SL4, and SL5.

Inner diameters of the first to fifth supply lines SL1, SL2, SL3, SL4, and SL5 may be different from each other. Accordingly, supply speeds (i.e., flow rate) of the processing fluids PF supplied from the first to fifth supply lines SL1, SL2, SL3, SL4, and SL5 may be different from each other.

Figure 3:
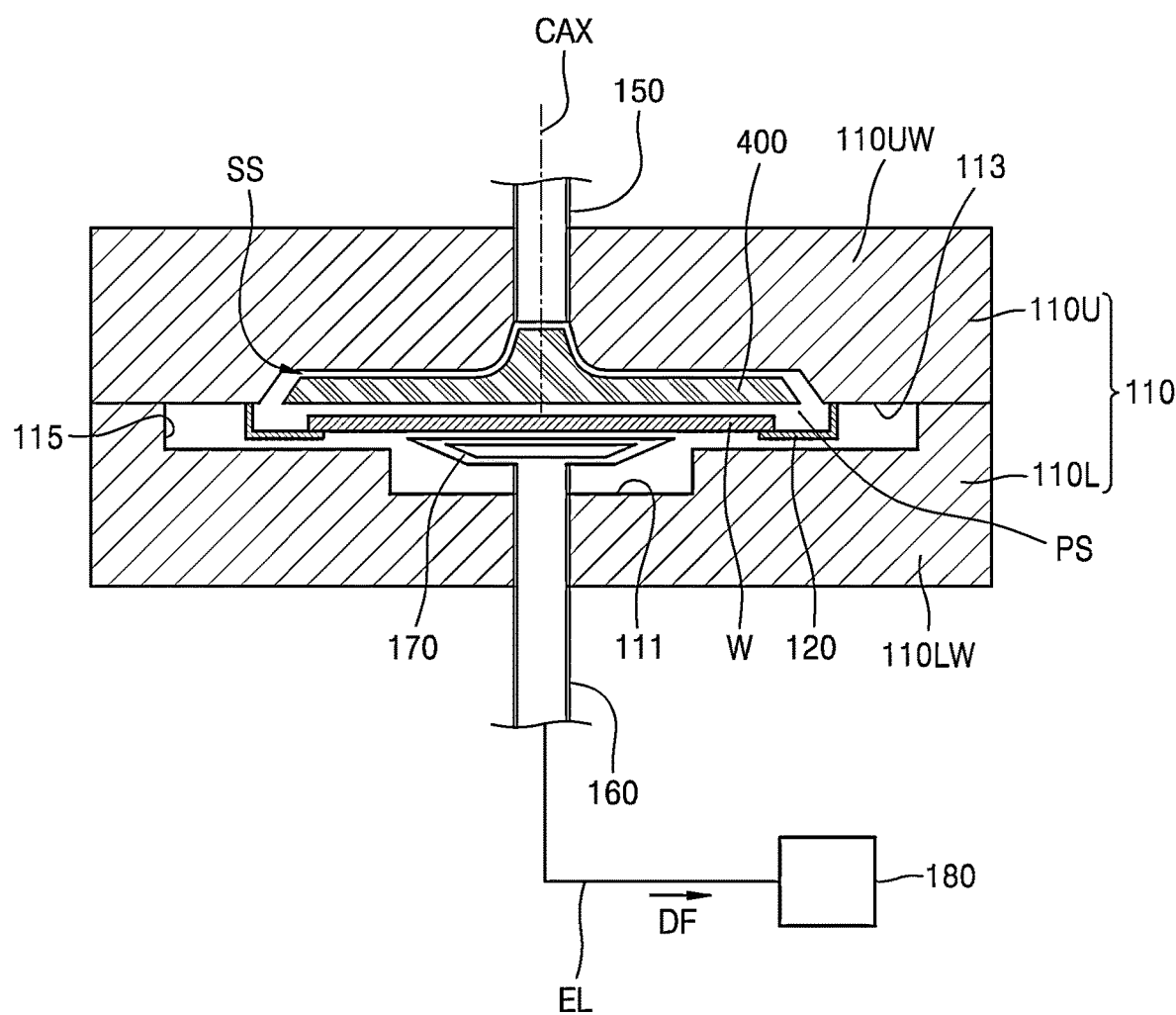
FIG. 3 is a cross-sectional view illustrating a substrate processing apparatus according to an embodiment of the inventive concept.

FIG. 3 is a cross-sectional view illustrating the substrate processing apparatus 100 according to an embodiment of the inventive concept.

Referring to FIG. 3, the substrate processing apparatus 100 may include the processing container 110, a substrate support 120, the fluid supply device 130, a container supply pipe 150, a shower head assembly 400, an exhaust pipe 160, and an exhaust device 180. The substrate support 120 may extend in a first direction (e.g., X direction) and a second direction (e.g., Y direction) perpendicular to the first direction.

The processing container 110 may provide a processing space PS for processing the substrate W. The processing container 110 may seal the processing space PS from the outside while processing the substrate W. The processing space PS may be defined by a lower surface 111, an upper surface 113, and a side surface 115 of the processing container 110. For example, the processing space PS may be defined by a lower wall 110LW of the processing container 110 including the lower surface 111 of the processing container 110, an upper wall 110UW of the processing container 110 including the upper surface 113 of the processing container 110, and a side wall of the processing container 110 defining the side surface 115 of the processing container 110.

In example embodiments, the processing space PS may have a symmetrical shape with respect to a central axis CAX of the processing container 110. For example, the processing space PS may have a rotationally symmetric shape with respect to the central axis CAX of the processing container 110. For example, the processing container 110 and the processing space PS may have a symmetrical shape or a mirror shape with respect to a certain reference plane.

The processing container 110 may include a lower body 110L and an upper body 110U. The upper body 110U may be over the lower body 110L. Each of the upper body 110U and the lower body 110L may include, for example, a metal material. For example, the upper body 110U may be coupled to the lower body 110L to cover a space provided by the lower body 110L. The upper body 110U and the lower body 110L may be switched between a closed state in which the processing space PS is sealed and an open state in which the processing space PS is open to the atmosphere outside the processing container 110.

In the closed state of the processing container 110, the upper body 110U may be coupled to the lower body 110L to seal the processing space PS. In the open state of the processing container 110, the upper body 110U may be separated from the lower body 110L, and the processing space PS may be open to the atmosphere outside the processing container 110. Switching between the closed state and the open state of the processing container 110 may be made by a lifting device 170 configured to move the upper body 110U in a third (i.e., vertical) direction (e.g., Z direction) with respect to the lower body 110L. The third direction being perpendicular to the first direction and the second direction.

The substrate support 120 may be in the processing space PS to support the substrate W. The substrate support 120 may support the substrate W such that an upper surface of the substrate W faces the upper surface 113 of the processing container 110 and a lower surface of the substrate W faces the lower surface 111 of the processing container 110. The upper surface of the substrate W may be a target surface to be processed by the substrate processing apparatus 100. The substrate support 120 may support the substrate W such that the center of the upper surface of the substrate W is aligned with the central axis CAX of the processing container 110.

The fluid supply device 130 may generate the processing fluid PF for processing the substrate W and supply the generated processing fluid PF to the processing space PS of the processing container 110. In example embodiments, the fluid supply device 130 may generate and supply a supercritical fluid, and the substrate processing device 100 may process the substrate W by using the supercritical fluid. For example, the substrate processing apparatus 100 may perform a drying process on the substrate W by using the supercritical fluid.

Physical properties, such as density, viscosity, diffusion coefficient, and polarity, of the supercritical fluid may be continuously changed from a gas-like state to a liquid-like state. The supercritical fluid is a material having a temperature higher than a critical temperature and pressure higher than critical pressure and may have diffusivity, viscosity, and surface tension of a gas and may also have solubility of a liquid. When a drying process on the substrate W is performed by using a supercritical fluid, the supercritical fluid having little surface tension may permeate into fine grooves of the substrate W and may dry a cleaning liquid and/or a rinsing liquid on the substrate W while preventing a leaning phenomenon from occurring or water spots from being generated.

For example, the supercritical fluid may include carbon dioxide ($CO_2$), water ($H_2O$), methane ($CH_4$), ethane ($C_2H_6$), propane ($C_3H_8$), ethylene ($C_2H_4$), propylene ($C_2H_2$), methanol ($C_2H_3OH$), ethanol ($C_2H_5OH$), sulfur hexafluoride ($SF_6$), acetone ($C_3H_8O$), or combinations thereof. In example embodiments, the fluid supply device 130 may generate and supply a supercritical fluid including carbon dioxide. The carbon dioxide has a low critical temperature of about 31° C. and a low critical pressure of about 73 bar and is non-toxic, non-flammable, and relatively inexpensive, and thus, the carbon dioxide may be easily used for drying the substrate W.

The fluid supply device 130 may supply the processing fluid PF to the processing space PS of the processing container 110 through the container supply pipe 150 on the upper wall 110UW of the processing container 110. The exhaust pipe 160 may extend in the lower wall 110LW of the processing container 110. The exhaust pipe 160 may extend downward from the lower surface 111 of the processing container 110. The container supply pipe 150 may extend in the upper wall 110UW of the processing container 110. The container supply pipe 150 may extend upward from the upper surface 113 of the processing container 110. For example, the container supply pipe 150 may be inserted into a mounting hole of the upper wall 110UW of the processing container 110.

The shower head assembly 400 may be disposed between the upper surface of the processing container 110 and the substrate W. The shower head assembly 400 may be separated from the upper surface of the processing container 110. For example, a part of an inner wall of the processing container 110 facing the shower head assembly 400 may be separated from the shower head assembly 400 such that a gap is formed between the shower head assembly 400 and the processing container 110. The container supply pipe 150 may protrude toward the processing space PS from the upper wall 110UW of the processing container 110. The container supply pipe 150 may be connected to the shower head assembly 400. The shower head assembly 400 may receive the processing fluid PF from the container supply pipe 150.

The shower head assembly 400 may diffuse the received processing fluid PF into the processing space PS.

The exhaust device 180 may discharge a waste fluid DF of the processing space PS to the outside of the processing container 110. The exhaust device 180 may be connected to the exhaust pipe 160 in the lower wall 110LW of the processing container 110 through an exhaust line EL. The exhaust device 180 may discharge the waste fluid DF in the processing space PS to the outside of the processing container 110 through the exhaust pipe 160. Here, the waste fluid DF may be defined as a fluid including various gases, chemicals, by-products, particles, and the processing fluid PF in the processing space PS. The waste fluid DF may be discharged from the processing space PS through the exhaust pipe 160.

The exhaust device 180 may include a vacuum pump, a reception unit for receiving the waste fluid DF, an opening/closing valve 181 of FIG. 1 installed on the exhaust line EL, a flow meter installed on the exhaust line EL, and so on. For example, in order to perform an exhaust operation through the exhaust device 180, the vacuum pump may reduce pressure in the exhaust pipe 160 to suck the waste fluid DF in the processing space PS into the exhaust pipe 160.

Furthermore, the exhaust device 180 may adjust pressure in the processing space PS to suck and remove the waste fluid DF in the processing space PS. The exhaust pipe 160 may extend in the lower wall 110LW of the processing container 110. The exhaust pipe 160 may extend downward from the lower surface 111 of the processing container 110. The waste fluid DF in the processing space PS may be sucked into the exhaust pipe 160 through an exhaust operation of the exhaust device 180. In example embodiments, the center of the exhaust pipe 160 may be aligned along the central axis CAX of the processing container 110.

Furthermore, the container supply pipe 150 may overlap the exhaust pipe 160 vertically or in the vertical (i.e., third) direction. In a plan view, the center of the container supply pipe 150 may be within the exhaust pipe 160. In example embodiments, the center of the exhaust pipe 160 may be aligned with the center of the container supply pipe 150 in the vertical direction. In example embodiments, the center of the exhaust pipe 160 may be aligned with the center of the container supply pipe 150 along the central axis CAX of the processing container 110.

Figure 4A:
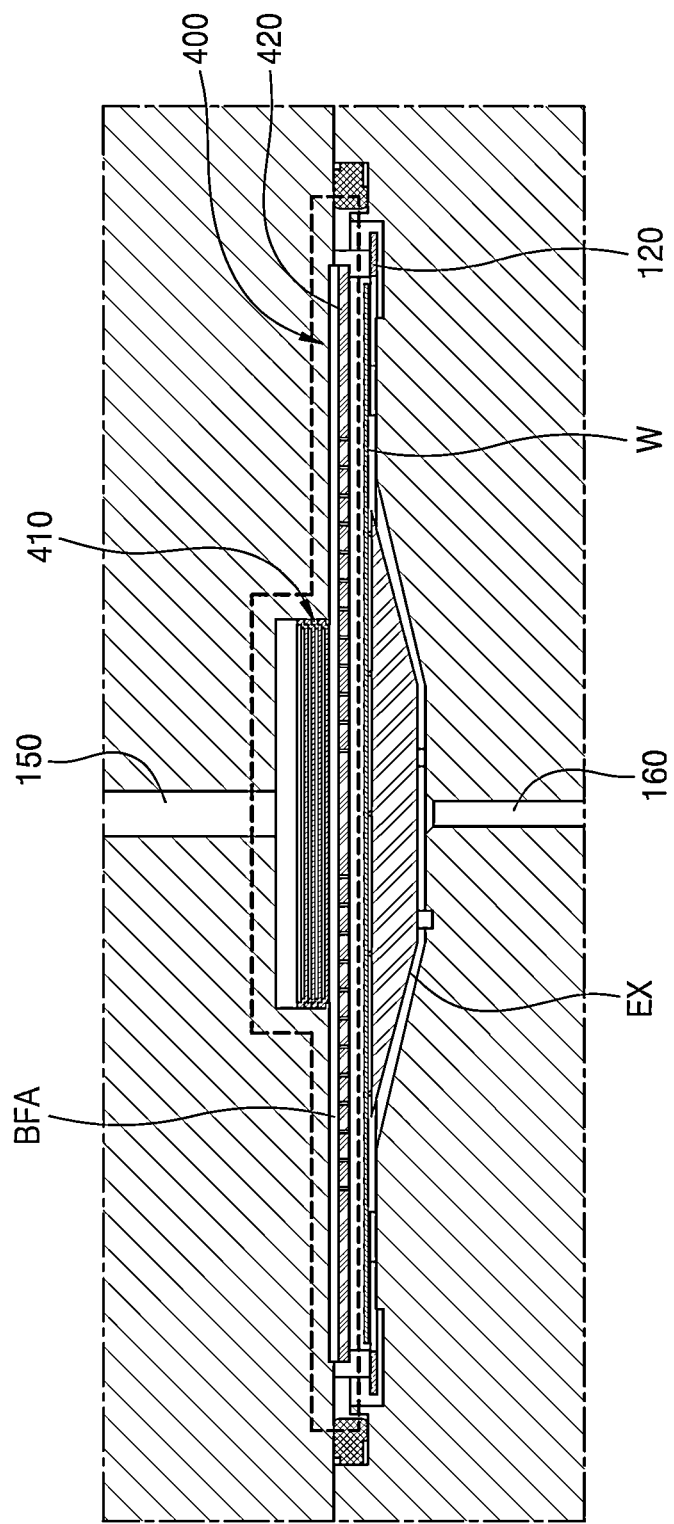
FIGS. 4A and 4B are cross-sectional views illustrating in more detail a substrate processing apparatus according to an example embodiment.
Figure 4B:
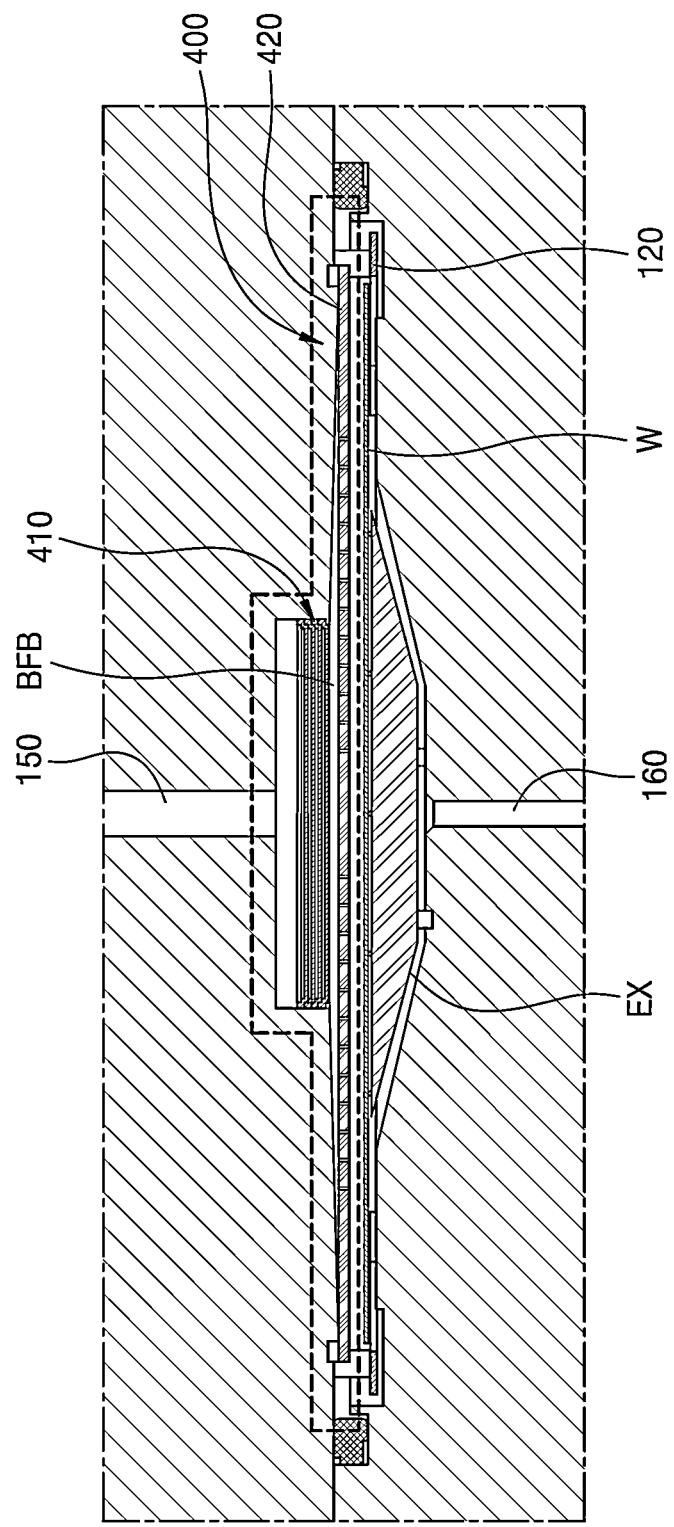

FIGS. 4A and 4B are cross-sectional views illustrating in more detail a substrate processing apparatus according to an embodiment of the inventive concept. Hereinafter, description will be made with reference to FIGS. 4A and 4B together with FIGS. 1 and 3, and descriptions previously given with reference to FIGS. 1 to 3 are briefly given or omitted.

Referring to FIGS. 3 and 4A, the shower head assembly 400 may include a first shower head 410 having a first diameter and a second shower head 420 having a second diameter. In an example embodiment, the second diameter of the second shower head 420 may be greater than the first diameter of the first shower head 410. In addition, the second diameter of the second shower head 420 may be greater than a diameter of the substrate W. The first diameter of the first shower head 410 may be less than the diameter of the substrate W. In example embodiments, the first diameter of the first shower head 410 may be greater than or equal to about 70 mm. In example embodiments, the second diameter of the second shower head 420 may be greater than or equal to about 300 mm. As described above, because the second diameter of the second shower head 420 is greater than the diameter of the substrate W, the processing fluid PF flowing through a passage (a passage B in FIG. 7B) between the second shower head 420 and the processing container 110 may flow into the lower body 110L of the processing container 110 without directly impacting the substrate W. For example, a part of the processing fluid PF may be diffused out of the substrate W. As illustrated in, for example, FIG. 5, a part of the processing fluid PF may be diffused along flow path F2 so as to enter the processing space PS and not diffused directly toward a top surface of the substrate W. For example, flow path F2 may be directed to a space outside an edge of the substrate W based on a center of the substrate W.

In example embodiments, the first shower head 410 and the second shower head 420 may each include a material having a high heat transfer coefficient. In example embodiments, the first shower head 410 and the second shower head 420 may each include a metal material. In example embodiments, the first shower head 410 and the second shower head 420 may each include stainless steel. Centers of the first shower head 410, the second shower head 420, and the substrate W may be aligned with one another along the central axis CAX of the processing container 110.

A buffer space BFA may be between the first shower head 410 and the second shower head 420. The buffer space BFA may be defined by a lower surface of the first shower head 410, an upper surface of the second shower head 420, and the upper surface of the processing container 110. A part of the upper surface 113 of the processing container 110 may face an upper surface of the second shower head 420. A part of the upper surface 113 of the processing container 110 may be a horizontal surface. A lower surface of the first shower head 410 may be at the same vertical level as the upper surface 113 of the processing container 110. The buffer space BFA may have a cylindrical shape. A width of the buffer space BFA may be the same as a width of the second shower head 420.

Referring to FIG. 4B, in example embodiments of the inventive concept, a buffer space BFB may be between the first shower head 410 and the second shower head 420. In addition, the buffer space BFB may be defined by a lower surface of the first shower head 410, an upper surface of the second shower head 420, and the upper surface of the processing container 110. The upper surface 113 of the processing container 110 may include an inclined surface with a vertical level that is reduced from an end of the first shower head 410 to an end of the second shower head 420. For example, the upper surface 113 of the processing container 110 may have an inclination with respect to the upper surface of the second shower head 420. For example, the buffer space BFB may have a truncated cone shape. A sidewall of the buffer space BFB may be defined by the upper surface 113 of the processing container 110, an upper wall of the buffer space BFB may be defined by a lower surface of the first shower head 410, and a lower wall of the buffer space BFB may be defined by an upper surface of the second shower head 420.

Referring to FIGS. 4A and 4B, the processing fluid PF passing through the first shower head 410 may diffuse in the buffer spaces BFA and BFB. Thereafter, the processing fluid PF diffused in the buffer spaces BFA and BFB may pass through the second shower head 420. For example, the processing fluid PF may be first diffused into the buffer spaces BFA and BFB through the first shower head 410, and then, may be second diffused into the processing space PS through the second shower head 420.

In addition, the upper surfaces 113 of the processing container 110 may not be in contact with the second shower head 420. For example, the upper surface 113 of the processing container 110 may be separated from an upper surface of the second shower head 420. Due to a gap between the upper surface 113 of the processing container 110 and the upper surface of the second shower head 420, the buffer spaces BFA and BFB may each have a partially opened portion (for example, an opening) at an outer lower portion. The gap between the upper surface 113 of the processing container 110 and the upper surface of the second shower head 420 may be adjacent to the upper surface of the second shower head 420.

Figure 5:
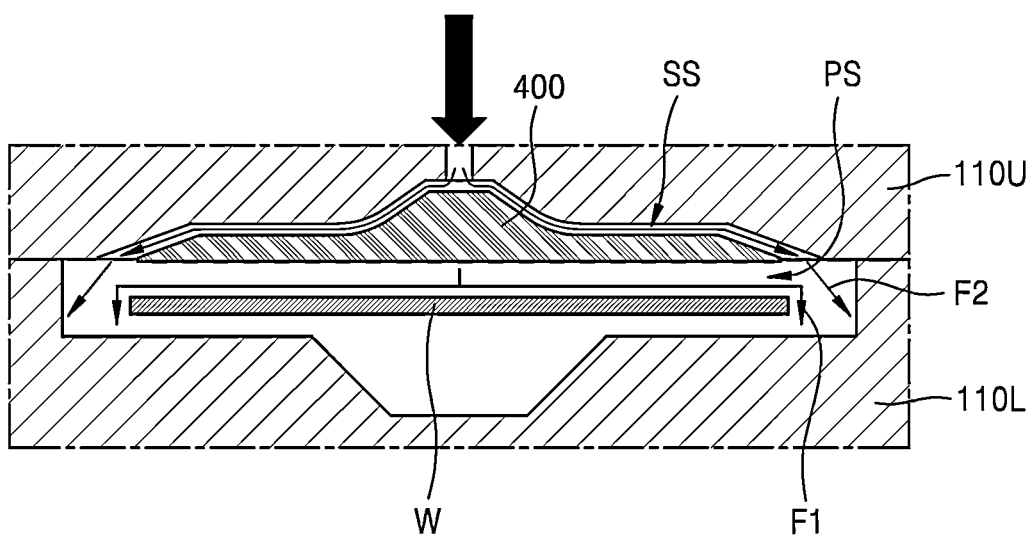
FIG. 5 is a conceptual view illustrating a flow of a fluid in a substrate processing apparatus according to an example embodiment of the inventive concept.

FIG. 5 is a conceptual diagram illustrating a flow of a fluid in a substrate processing apparatus according to an example embodiment of the inventive concept. Hereinafter, descriptions will be made with reference to FIG. 5 together with FIGS. 1 and 3, and descriptions previously given with reference to FIGS. 1 to 3 are briefly given or omitted.

Referring to FIGS. 3 and 5, the upper body 110U of the processing container 110 may be separated from the shower head assembly 400 in the third (i.e., vertical) direction. For example, a separation space SS may be between the upper body 110U of the processing container 110 and the shower head assembly 400. The processing fluid PF may flow into the separation space SS as illustrated by F2. For example, a part of the processing fluid PF supplied from the container supply pipe 150 may be supplied to the processing space PS through the separation space SS without passing through the shower head assembly 400. The separation space SS is described in detail with reference to FIG. 6. As illustrated in FIG. 3, for example, an upper surface of the separation space SS may have a conical shape having an inclination with respect to the shower head assembly 400. As illustrated by F1, another part of the processing fluid PF supplied from the container supply pipe 150 may be supplied to the processing space PS and onto substrate W through a separation space between the shower head assembly 400 and the substrate W.

Figure 6:
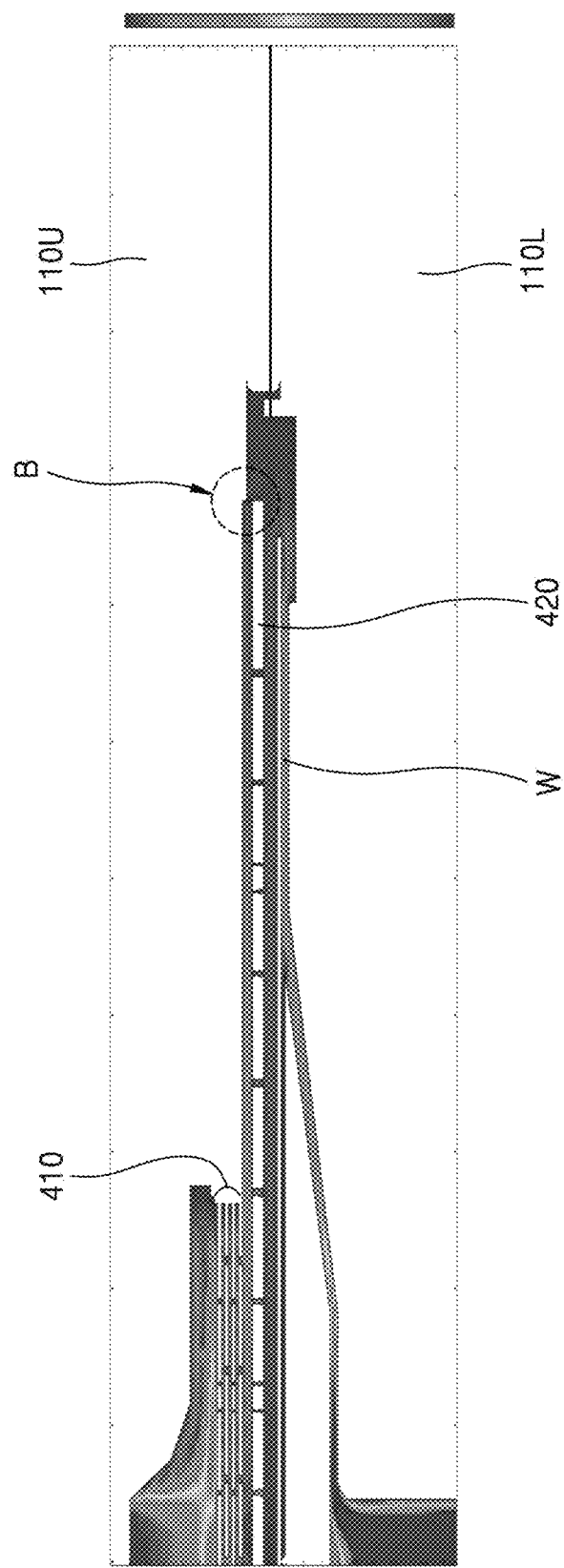
FIG. 6 is an image simulating a flow of a fluid in a substrate processing apparatus according to an example embodiment of the inventive concept.
Figure 7A:
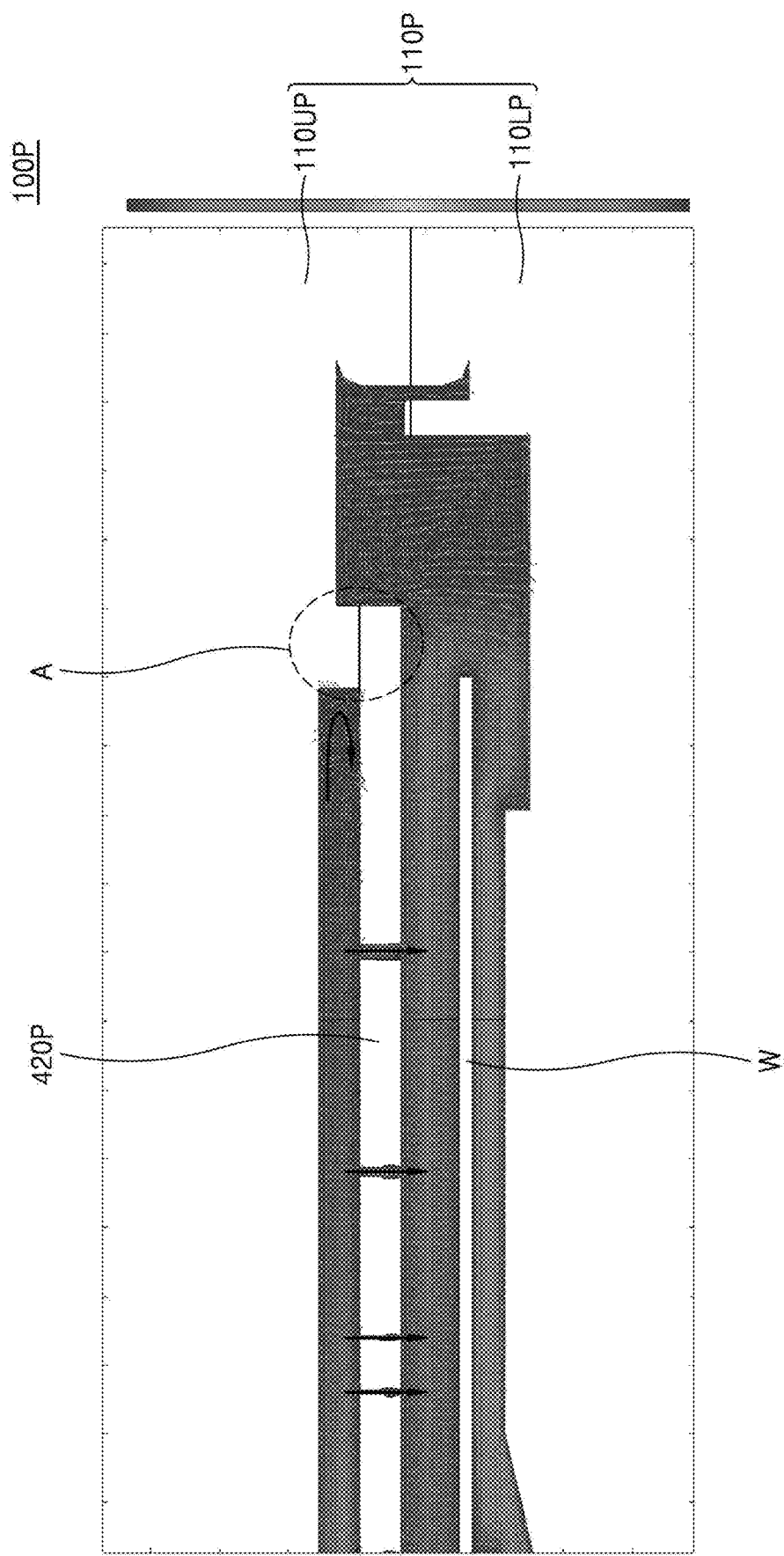
FIG. 7A is a partial enlarged view schematically illustrating a flow of a fluid flowing in a processing space of a substrate processing apparatus according to a comparative example.
Figure 7B:
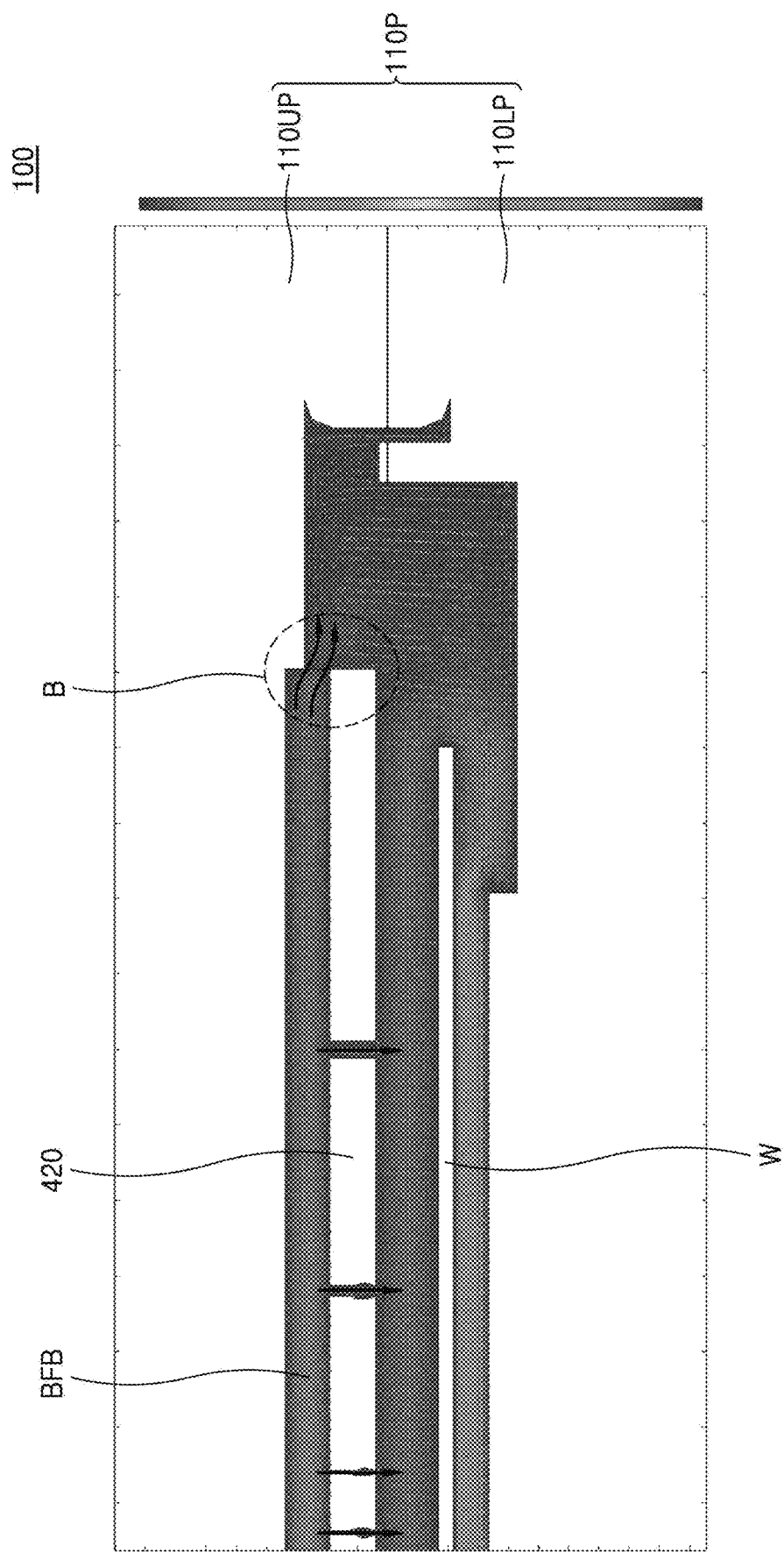
FIG. 7B is a view schematically illustrating a flow of a fluid flowing in a processing space of the substrate processing apparatus of FIG. 6.

FIG. 6 is an image simulating a flow of a fluid in the substrate processing apparatus 100 according to an example embodiment of the inventive concept. FIG. 7A is a partial enlarged view schematically illustrating a flow of a fluid flowing in a processing space of a substrate processing apparatus according to a comparative example. FIG. 7B is a view schematically illustrating a flow of a fluid flowing in a processing space of the substrate processing apparatus 100 of FIG. 6. In FIGS. 6, 7A, and 7B, shaded portions represent flows of fluids. Hereinafter, descriptions will be made with reference to FIGS. 6 to 7B together with FIGS. 1 and 3, and descriptions previously given with reference to FIGS. 1 to 3 are briefly given or omitted.

Referring first to FIG. 7A, in a substrate processing apparatus 100P according to the comparative example, a second shower head 420P is in contact with an upper body 110UP of a processing container 110P. Therefore, a flow path is not formed between the second shower head 420P and the upper body 110UP of the processing container 110P, and the processing fluid passing through a first shower head (not illustrated) flows into the second shower head 420P.

Referring to FIGS. 6 and 7B, a second shower head 420 may be separated from an upper body 110U of the processing container 110P. A flow path B may be formed in the outside of the second shower head 420. Because of this, some of the processing fluid PF passing through the first shower head 410 may pass through the second shower head 420, and the remainder of the processing fluid PF may flow into the processing space PS through the flow path B. Accordingly, when the processing fluid PF flows onto the substrate W, the processing fluid PF may be dispersed into the second shower head 420 and the flow path B, and thus, hydraulic pressure and a flow rate of the processing fluid PF may be reduced. Due to the reduction in the hydraulic pressure and the flow rate of the processing fluid PF, an impact applied to the substrate W may be reduced and defects may be prevented from occurring on the substrate W. In addition, a pattern on the substrate W may be prevented from being damaged by providing the processing fluid PF onto the substrate W in a dispersed manner.

Figure 8:
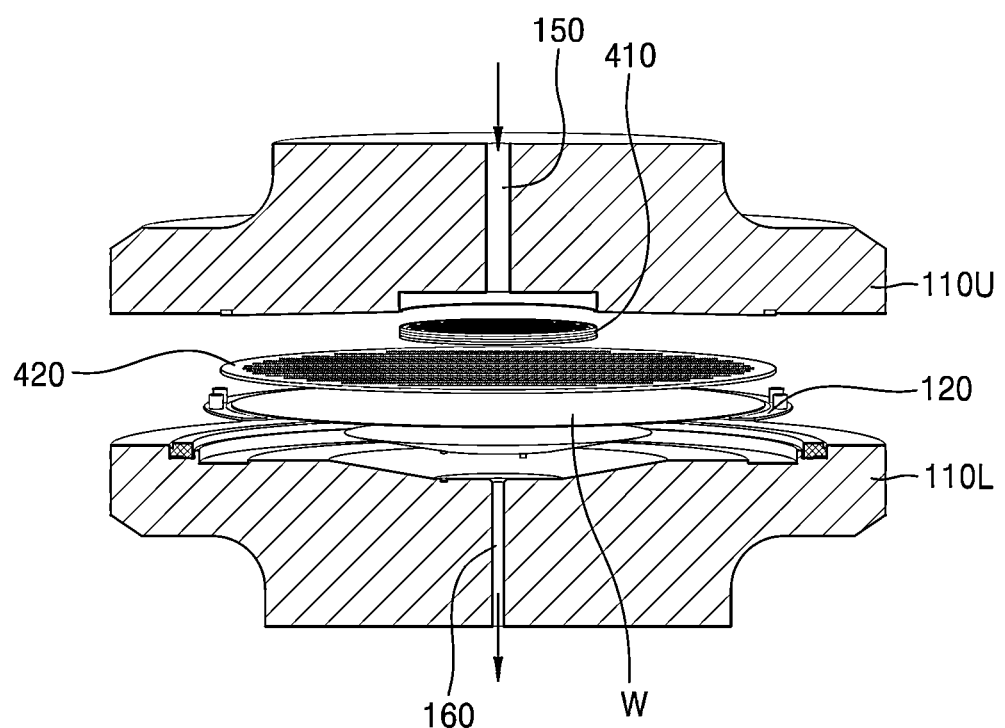
FIG. 8 is a perspective view illustrating a substrate processing apparatus according to an embodiment of the inventive concept.
Figure 9A:
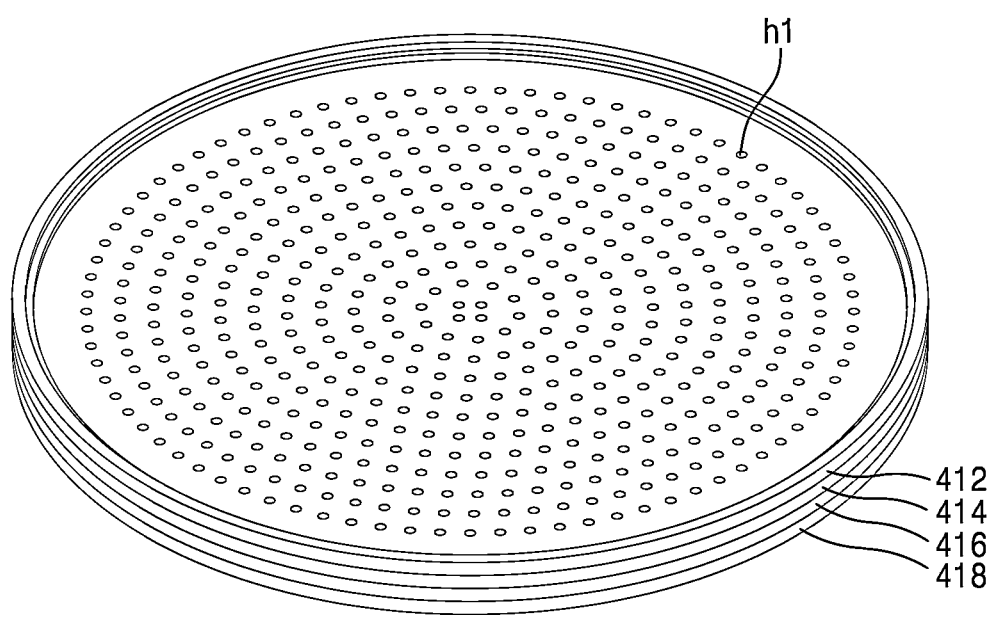
FIGS. 9A and 9B are respectively a perspective view and a cross-sectional view illustrating a first shower head of a substrate processing apparatus according to an example embodiment of the inventive concept.
Figure 9B:
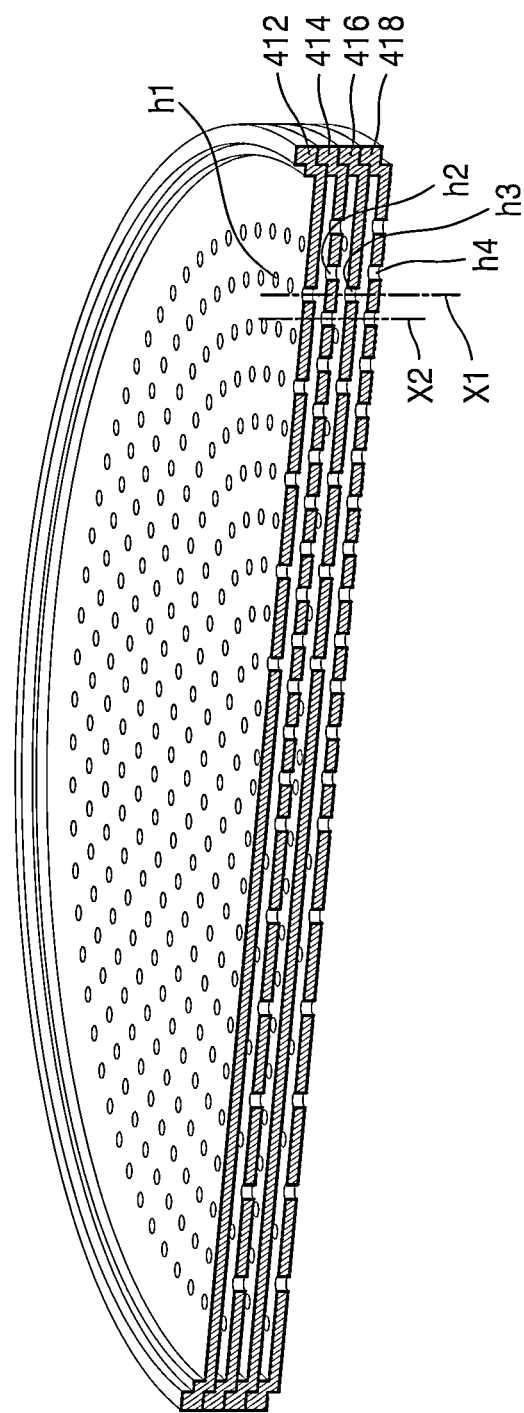

FIG. 8 is a perspective view illustrating a substrate processing apparatus according to an embodiment of the inventive concept. FIGS. 9A and 9B are respectively a perspective view and a cross-sectional view illustrating a first shower head of a substrate processing apparatus according to an example embodiment of the inventive concept. Hereinafter, descriptions will be made with reference to FIGS. 8 to 9B together with FIGS. 1 and 3, and descriptions previously given with reference to FIGS. 1 to 3 are briefly given or omitted.

Referring to FIGS. 8, 9A, and 9B, the first shower head 410 may be between the upper body 110U of the processing container 110 and the second shower head 420. The first shower head 410 may include a plurality of plates. In example embodiments, the first shower head 410 may include a first plate 412 in which first holes h1 are formed, a second plate 414 in which second holes h2 are formed, a third plate 416 in which third holes h3 are formed, and a fourth plate 418 in which fourth holes h4 are formed.

The first plate 412, the second plate 414, the third plate 416, and the fourth plate 418 may be sequentially stacked in the third (i.e., vertical) direction. For example, the first plate 412 may be at the uppermost portion and the fourth plate 418 may be at the lowermost portion. In example embodiments, each of the first hole h1, the second hole h2, the third hole h3, and the fourth hole h4 may have a diameter selected from a range between about 1.5 mm to about 4 mm.

Central axes of the first hole h1 of the first plate 412 and the third hole h3 of the third plate 416 may be aligned with one another in the vertical direction. In example embodiments, the central axis of each of the first hole h1 and the third hole h3 may include a first central axis X1. Central axes of the second hole h2 of the second plate 414 and the fourth hole h4 of the fourth plate 418 may be aligned with one another in the vertical direction. In example embodiments, the central axis of each of the second hole h2 and the fourth hole h4 may include a second central axis X2. Here, the central axis of the first hole h1 and the central axis of the second hole h2 may be separated from each other in a horizontal direction (e.g., one of the X direction and the Y direction) without being aligned with each other in the vertical direction. In addition, the central axis of the third hole h3 and the central axis of the fourth hole h4 may be separated from each other in a horizontal direction without being aligned with each other in the vertical direction. For example, the first central axis X1 may be separated from the second central axis X2 in a horizontal direction.

When viewed in a cross-section, the first hole h1, the second hole h2, the third hole h3, and the fourth hole h4 may be arranged in a zigzag direction. Accordingly, the first shower head 410 may primarily reduce a flow rate and hydraulic pressure of the processing fluid PF flowing thereinto from the container supply pipe 150. The processing fluid PF flowing out of the container supply pipe 150 may flow into the buffer space (for example, BFA of FIG. 4A) by passing through the first hole h1, the second hole h2, the third hole h3, and the fourth hole h4 in a zigzag.

Figure 10A:
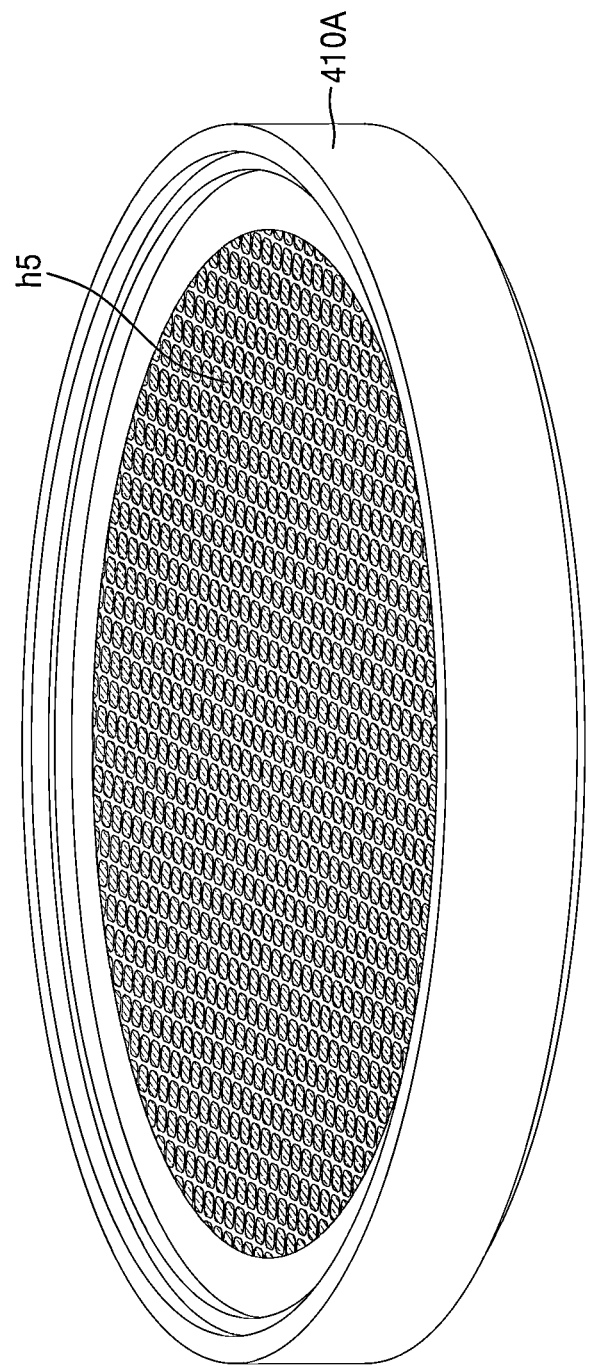
FIGS. 10A and 10B are respectively a perspective view and a cross-sectional view illustrating a first shower head of a substrate processing apparatus according to an example embodiment of the inventive concept.
Figure 10B:
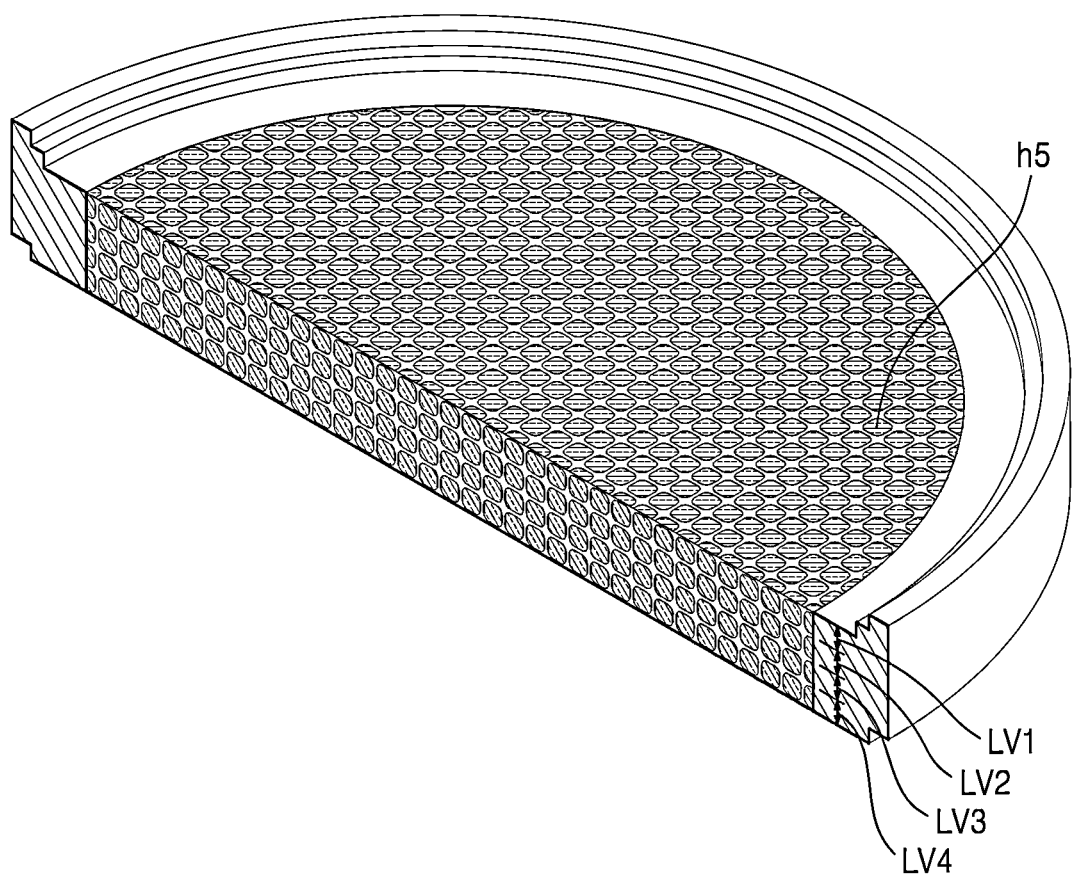
Figure 11:
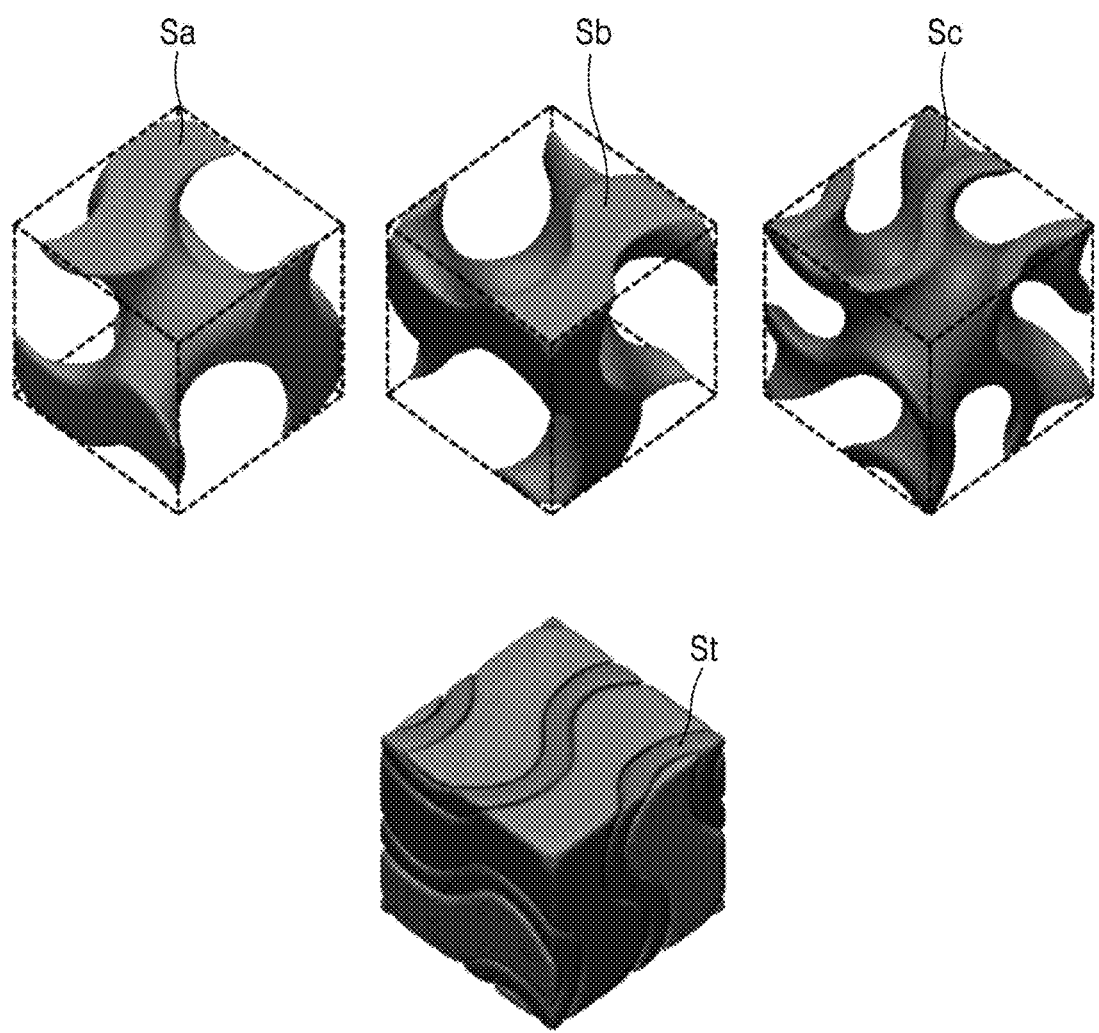
FIG. 11 illustrates configurations of the first shower head of the substrate processing apparatus of FIG. 10A.

FIGS. 10A and 10B are respectively a perspective view and a cross-sectional view illustrating a first shower head of a substrate processing apparatus according to an example embodiment of the inventive concept. FIG. 11 illustrates configurations of the first shower head of the substrate processing apparatus of FIG. 10A. Descriptions will be made below with reference to FIGS. 10A to 11 together with FIGS. 3 and 8, and descriptions previously given with reference to FIGS. 1 to 3 are briefly described or omitted.

Referring to FIGS. 10A, 10B, and 11, in another example embodiment, the first shower head 410A may include a plurality of holes h5. The plurality of holes h5 may be arranged in a matrix in the first shower head 410. The plurality of holes h5 may be formed by a 3D printing method. In an example embodiment, the plurality of holes h5 may form a triple periodic minimal surface (TPMS) shape St illustrated in FIG. 11. Referring to FIG. 11, shapes of the plurality of holes h5 may each be any one of a P-surface Sa, a D-surface Sb, and an H-surface Sc.

The plurality of holes h5 may be arranged in one layer at each of a first vertical level LV1, a second vertical level LV2, a third vertical level LV3, and a fourth vertical level LV4. The plurality of holes h5 may be aligned with one another in the vertical direction on the first to fourth vertical levels LV1, LV2, LV3, and LV4. The plurality of holes h5 may be separated from each other at equal intervals in the first shower head 410A.

Figure 12:
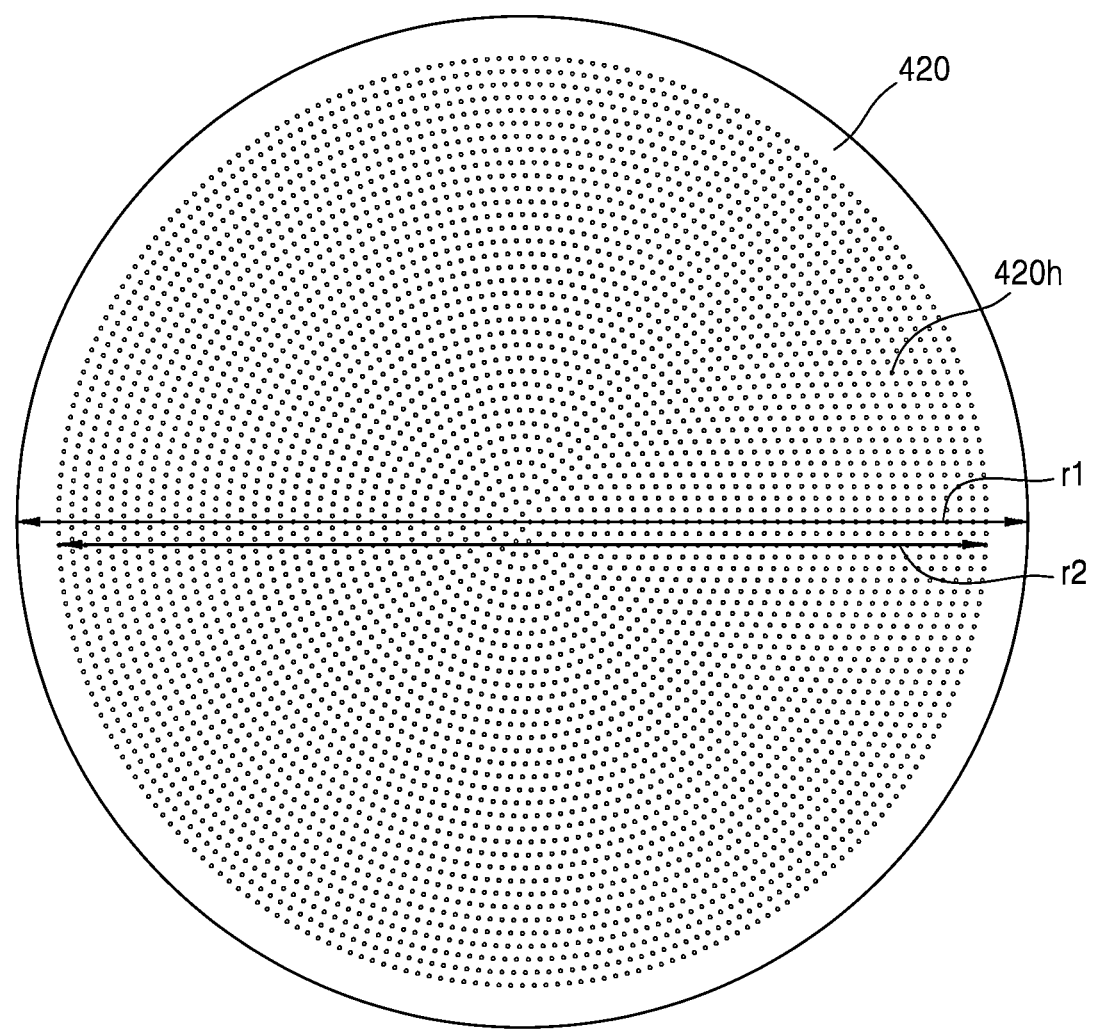
FIG. 12 is a view illustrating a configuration of a second shower head of a substrate processing apparatus according to an example embodiment of the inventive concept.

FIG. 12 is a view illustrating a configuration of a second shower head of a substrate processing apparatus according to an example embodiment of the inventive concept.

Referring to FIG. 12, the second shower head 420 of the substrate processing apparatus may include one plate. A plurality of holes 420h may be in the second shower head 420. A diameter r1 of the second shower head 420 may be greater than a diameter r2 of an inner diameter in which the plurality of holes 420h are arranged. The diameter r1 of the second shower head 420 may be greater than a diameter of the substrate W. The diameter r2 of the inner diameter in which the plurality of holes 420h are arranged may be greater than or equal to 300 mm. In example embodiments, the diameter r1 of the second shower head 420 may be about 308 mm.

Figure 13:
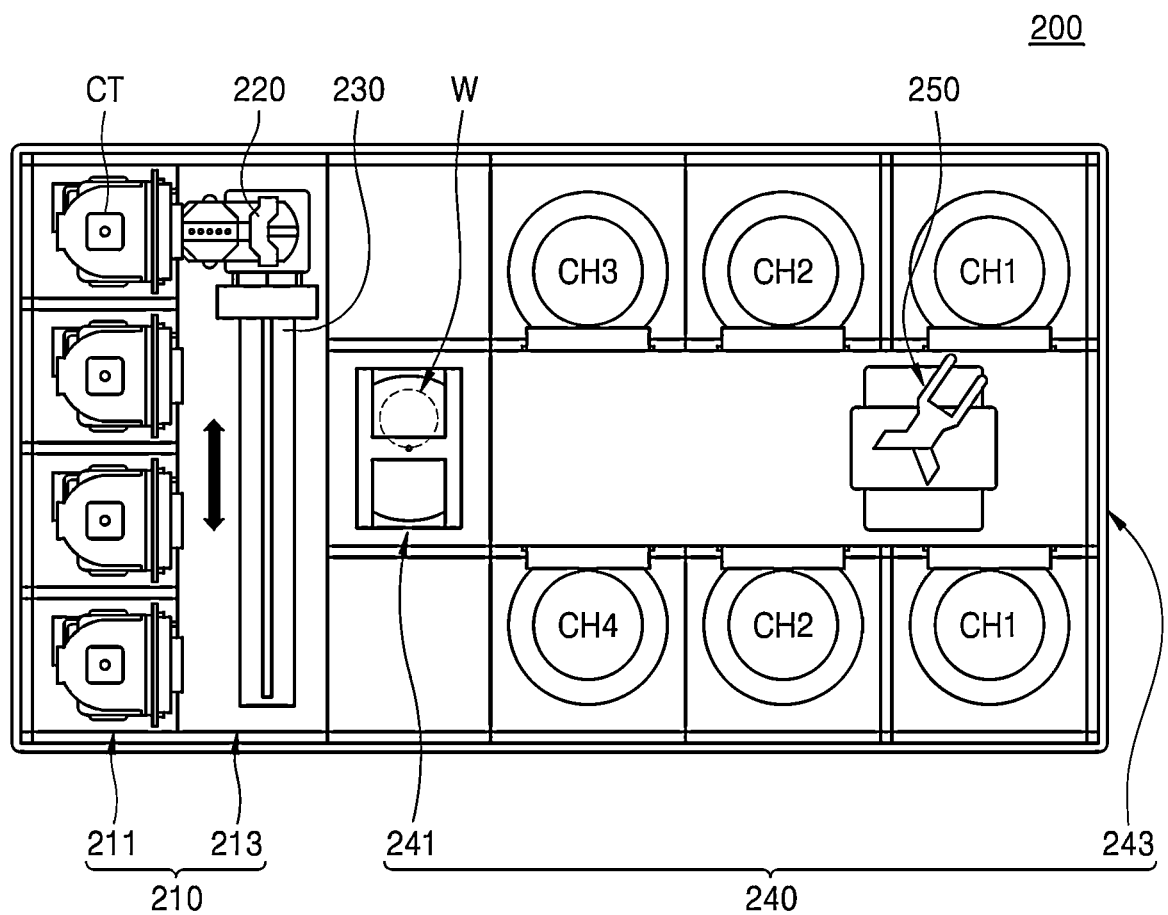
FIG. 13 is a cross-sectional view illustrating a substrate processing apparatus according to an example embodiment of the inventive concept.

FIG. 13 is a cross-sectional view illustrating the substrate processing apparatus 200 according to an example embodiment of the inventive concept.

Referring to FIG. 13, the substrate processing apparatus 200 may include an index module 210, a processing module 240, and a substrate transfer unit 250.

The index module 210 may include a load port 211 and a transfer frame 213. The load port 211, the transfer frame 213, and the processing module 240 may be sequentially arranged in a row. Hereinafter, a direction in which the load port 211, the transfer frame 213, and the processing module 240 are arranged in a row extending in the X direction.

A container CT in which the substrate W is accommodated may be safely placed on the load port 211. The load port 211 may include a plurality of load ports, which may be arranged in a row in the Y direction. Although four load ports 211 are illustrated in FIG. 13, the number of load ports 211 may increase or decrease depending on conditions, such as process efficiency and/or an installation area of the processing module 240. The container CT may include a plurality of slots configured to support an edge of the substrate W. The plurality of slots may be separated from each other in the Z direction, and accordingly, a plurality of substrates W may be mounted in the container CT in the Z direction. The container CT may include, for example, a front opening unified pod (FOUP).

The transfer frame 213 may transfer the substrate W between the container CT on the load port 211 and a buffer chamber 241 of the processing module 240. The transfer frame 213 may include an index robot 220 and an index rail 230. The index rail 230 may extend in the Y direction. The index robot 220 may be installed on the index rail 230 and linearly move on the index rail 230 in the Y direction.

The processing module 240 may include the buffer chamber 241, a transfer chamber 243, and first to fourth process chambers CH1, CH2, CH3, and CH4. The transfer chamber 243 may extend in the X direction. In some embodiments, the first to fourth process chambers CH1, CH2, CH3, and CH4 may be separated from each other in the Y direction with the transfer chamber 243 therebetween. In addition, the first to fourth process chambers CH1, CH2, CH3, and CH4 may be arranged in the X direction. In other embodiments, some of the first to fourth process chambers CH1, CH2, CH3, and CH4 may be stacked in the Z direction.

The arrangement of the first to fourth process chambers CH1, CH2, CH3, and CH4 in the drawing is an example, and the first to fourth process chambers CH1, CH2, CH3, and CH4 may be arranged in various ways as necessary. For example, all of the first to fourth process chambers CH1, CH2, CH3, and CH4 may be arranged only on one side of the transfer chamber 243.

The buffer chamber 241 may be between the transfer frame 213 and the transfer chamber 243. The buffer chamber 241 may provide a space in which the substrate W is stored between the transfer chamber 243 and the transfer frame 213. The buffer chamber 241 may include a plurality of slots, which are internal spaces for storing the substrate W. The plurality of slots may overlap each other and may be separated from each other in the Z direction. The buffer chamber 241 may have openings, through which the substrate W may come in and out, respectively, in a surface facing the transfer frame 213 and a surface facing the transfer chamber 243.

The transfer chamber 243 may transfer the substrate W between the buffer chamber 241 and the first to fourth process chambers CH1, CH2, CH3, and CH4. The substrate transfer unit 250 may be in the transfer chamber 243. The substrate transport unit 250 may be installed on a rail extending in the X direction and may move in the X direction on the rail. The substrate W may be transferred by the substrate transfer unit 250 between the first to fourth process chambers CH1, CH2, CH3, and CH4.

The first to fourth process chambers CH1, CH2, CH3, and CH4 may sequentially process one substrate W. For example, a development process is performed on the substrate W in the first process chamber CH1, and then a drying process may be performed on the substrate W in the second process chamber CH2. Here, the development process is a process of removing a photoresist exposed (or unexposed) by extreme ultra-violet (EUV) light during an exposure process. The drying process may be performed with a processing fluid in a supercritical state. In some embodiments, the process fluid in a supercritical state may include carbon dioxide ($CO_2$).

The first process chamber CH1 may supply a developer to the substrate W in a dry state by using a spraying device. The developer may be, for example, a non-polar organic solvent. The developer may be a liquid that may selectively remove a soluble region of the EUV photoresist. For example, the substrate W in a dry state may become a substrate W in a wet state due to a developer in the first process chamber CH1. A plurality of first process chambers CH1 may be in the process module 240, and the number of first process chambers CH1 may increase or decrease depending on conditions, such as process efficiency and/or an installation area of the process module 240.

The second process chamber CH2 may receive the substrate W in a wet state from the first process chamber CH1 and remove the developer from the transferred substrate W by using a supercritical fluid. The related art uses a method of rotating the substrate W at a high speed, but during high-speed rotation, an EUV photoresist pattern may be collapsed due to surface tension.

To solve this problem, a developer may be removed by dissolving the developer in the supercritical fluid and then discharging the supercritical fluid. In this way, the substrate W in a wet state may be dried by removing both the developer and the supercritical fluid from the substrate W. For example, the substrate W in a wet state may become the substrate W in a dry state due to the drying process of the second process chamber CH2. A plurality of second process chambers CH2 may be in the process module 240, and the number of second process chambers CH2 may increase or decrease depending on conditions, such as process efficiency and/or an installation area of the process module 240. In example embodiments, the second process chamber CH2 may correspond to any one of the substrate processing apparatuses 100 and 101 described with reference to FIGS. 1 to 11.

The third process chamber CH3 may receive the substrate W from the second process chamber CH2 and perform a baking process to completely dry the substrate W. The baking process may be performed on the substrate W at a temperature of about 120° C. to about 170° C. for about 30 seconds to about 120 seconds on a hot plate in the third process chamber CH3. For example, the substrate W may be maintained in a dry state due to the baking process of the third process chamber CH3.

The fourth process chamber CH4 may receive the substrate W from the third process chamber CH3 and perform a cooling process to lower a temperature of the substrate W. The cooling process may be performed on a cooling plate in the fourth process chamber CH4. For example, the substrate W may be maintained in a dry state due to the cooling process of the fourth process chamber CH4.

Figure 14:
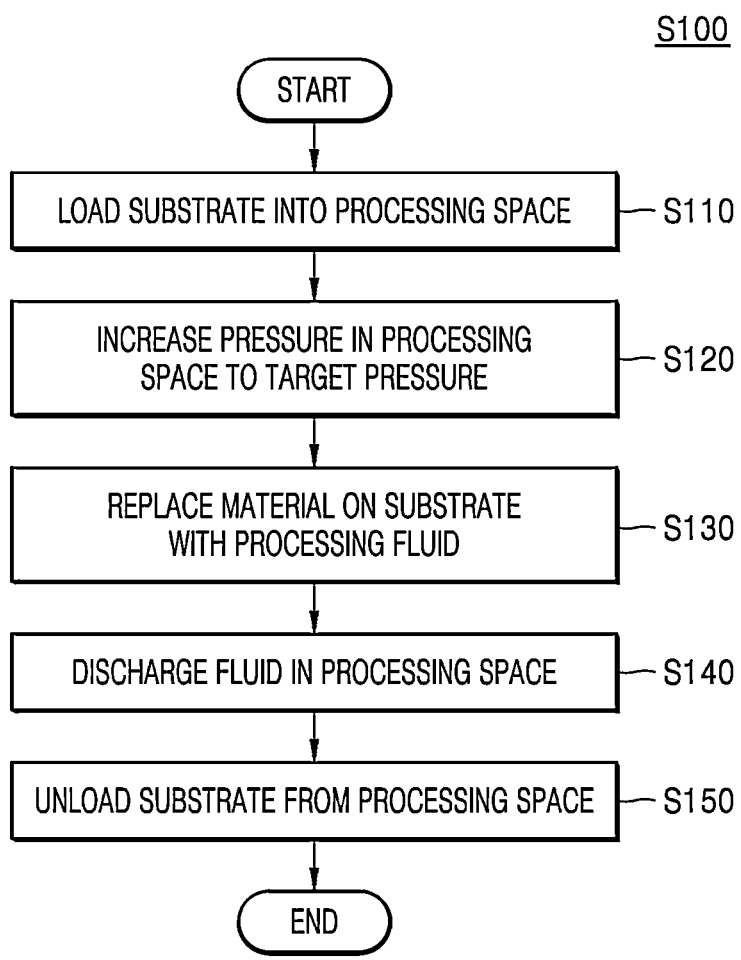
FIG. 14 is a flowchart illustrating a substrate processing method according to an example embodiment of the inventive concept.
Figure 15:
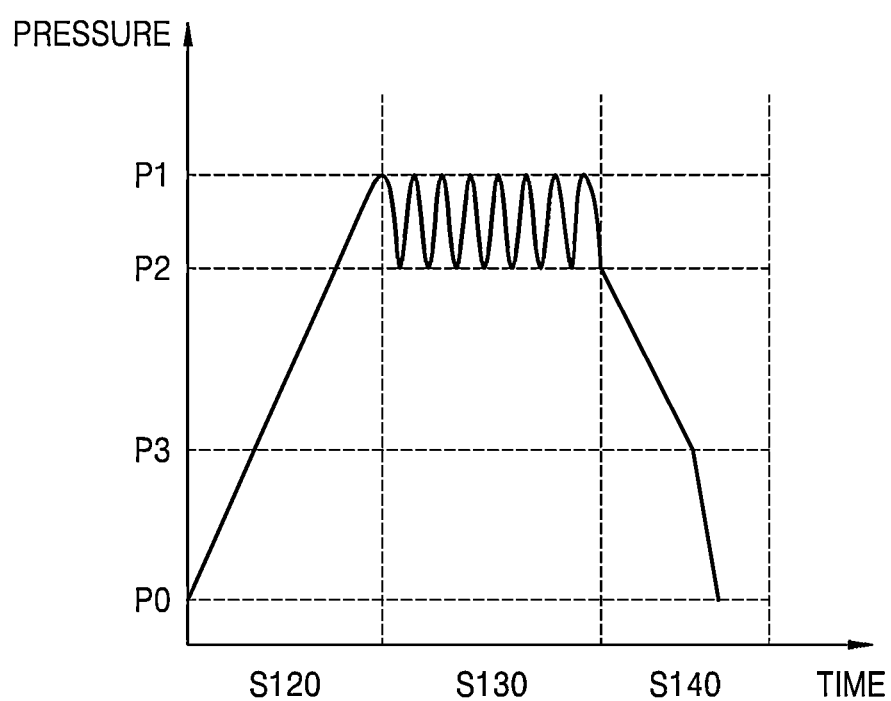
FIG. 15 is a graph illustrating pressure in a processing space while a substrate is being processed.

FIG. 14 is a flowchart illustrating a substrate processing method according to an example embodiment of the inventive concept. FIG. 15 is a graph illustrating pressure in a processing space while a substrate is being processed.

Hereinafter, an example of a substrate drying method (S100) using the substrate processing apparatus 100 described with reference to FIGS. 1 to 3 will be described.

First, the substrate W is loaded into the processing space PS of the processing container 110 (S110). While the substrate W is being loaded into the processing space PS, the processing container 110 may be in an open position. The substrate W may be safely placed on the substrate support 120. When the substrate W is loaded onto the substrate support 120, the processing container 110 may switch from an open position to a closed position such that the processing space PS is sealed from the outside of the processing container 110.

When a loading operation of the substrate W is completed, a drying process is performed on the substrate W. The drying process on the substrate W includes an operation of increasing pressure in the processing space PS to target pressure (S120), an operation of replacing a material on the substrate W with the processing fluid PF (S130), and an operation of discharging the waste fluid DF in the processing space PS (S140).

Operation S120 may include supplying the processing fluid PF in a supercritical state to the processing space PS to fill the processing space PS with the supercritical fluid. In example embodiments, the fluid supply device 130 may supply the processing fluid PF in a supercritical state to the processing space PS to increase the pressure in the processing space PS from an initial pressure P0, which is similar to atmospheric pressure, to the first pressure P1. In example embodiments, the first pressure P1 may be higher than critical pressure of the processing fluid PF and may be, for example, about 150 bar.

In example embodiments, operation S120 includes a first supply operation of supplying the processing fluid PF at a first temperature to a lower portion of the processing space PS through the first supply pipe, and a second supply operation of supplying the processing fluid PF at a second temperature to an upper portion of the processing space PS through the container supply pipe 150. In the first supply operation, the first temperature of the processing fluid PF may be between about 35° C. and about 70° C. In the second supply operation, the second temperature of the processing fluid PF may be higher than the first temperature. In the second supply operation, the second temperature of the processing fluid PF may be between about 70° C. and about 120° C. The first supply operation may be performed until the pressure in the processing space PS reaches target intermediate pressure between the initial pressure P0 and the first pressure P1, and for example, the target intermediate pressure may be between about 75 bar and about 90 bar. When the pressure in the processing space PS reaches the target intermediate pressure through the first supply operation, the second supply operation may be performed. The second supply operation may be performed until the pressure in the processing space PS reaches the first pressure P1.

In operation S130, a material (for example, a developer and/or a rinse liquid) on the substrate W may be mixed (or replaced) with the processing fluid PF, and the mixed fluid may be discharged through the exhaust pipe 160.

Operation S130 may include a pressure reduction process of reducing the pressure in the processing space PS from the first pressure P1 to second pressure P2 that is lower than the first pressure P1, and a pressure increase process of increasing the pressure in the processing space PS from the second pressure P2 to the first pressure P1. The second pressure P2 may be between about 75 bar and about 90 bar. Operation S130 may include repeating the pressure reduction process and the pressure increase process alternately at least two or more times. The pressure reduction process may include discharging the waste fluid DF in the processing space PS through the exhaust device 180. The pressure increase process may include supplying the processing fluid PF of the second temperature to an upper portion of the processing space PS through the container supply pipe 150.

In operation S140, the exhaust device 180 may discharge the waste fluid DF in the processing space PS to reduce the pressure in the processing space PS to the initial pressure P0. Here, the operation of reducing the pressure in the processing space PS may be divided into two operations. First, a low-speed exhaust process (low-speed pressure reduction) of reducing the pressure in the processing space PS to third pressure P3 may be performed, and a high-speed exhaust process (high-speed pressure reduction) of reducing the pressure in the processing space PS to initial pressure P0, which is similar to atmospheric pressure, may be performed.

When the drying process on the substrate W is completed, the processing container 110 may be switched from a closed state to an open state, and the substrate W may be unloaded from the processing space PS (S150).

Figure 16:
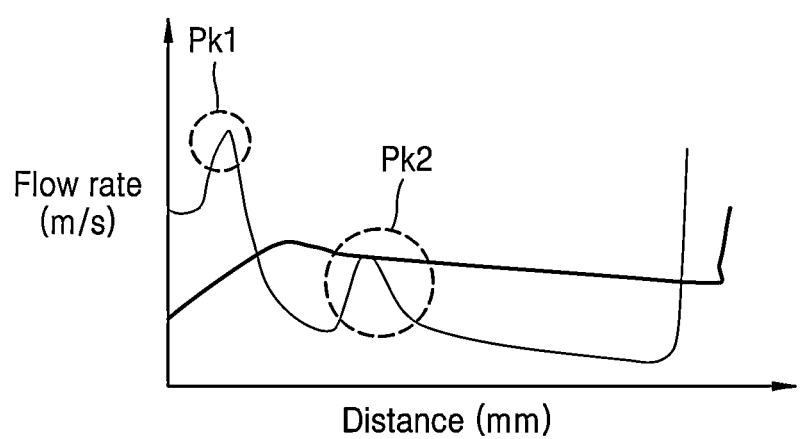
FIG. 16 is a graph illustrating an effect of a substrate processing apparatus according to an example embodiment of the inventive concept.

FIG. 16 is a graph illustrating a flow of a processing fluid in a substrate processing apparatus according to an example embodiment of the inventive concept.

Referring to FIG. 16, the horizontal axis of the graph represents a distance (unit: mm) from the center of the substrate W, and the vertical axis represents a flow rate (unit: m/s) of the processing fluid PF. A thin solid line represents a flow rate of the processing fluid PF in the substrate processing apparatus according to a comparative example, and a thick solid line represent flow rates of the processing fluid PF in the substrate processing apparatus 100 according to aspects of the inventive concept. Hereinafter, descriptions will be made with reference to FIG. 16 together with FIGS. 6 and 7B.

When a processing fluid in a substrate processing apparatus according to a comparative example flows onto a substrate in the vertical direction by passing through a first shower head and a second shower head, a first peak Pk1 with a high flow rate appears. In addition, in the comparative example, a diameter of the second showerhead in the substrate processing apparatus is less than a diameter of the substrate, and accordingly, the processing fluid impacts the periphery of the substrate, resulting in the appearance of a second peak Pk2 with a high flow rate.

In contrast to comparative example, according to aspects of the inventive concept, the second shower head 420 is separated from the upper surface 113 of the processing container 110 to form the flow path B (see FIG. 7B). Because of this, the processing fluid PF flowing from the first shower head 410 into a buffer space is distributed to the second shower head 420 and the flow path B. Accordingly, hydraulic pressure and a flow rate of the processing fluid PF flowing from the first shower head 410 into the processing space PS are reduced, and as a result, the first peak Pk1 and the second peak Pk2 do not appear. In addition, a flow rate of the processing fluid PF on the substrate W is substantially constant.

Figure 17:
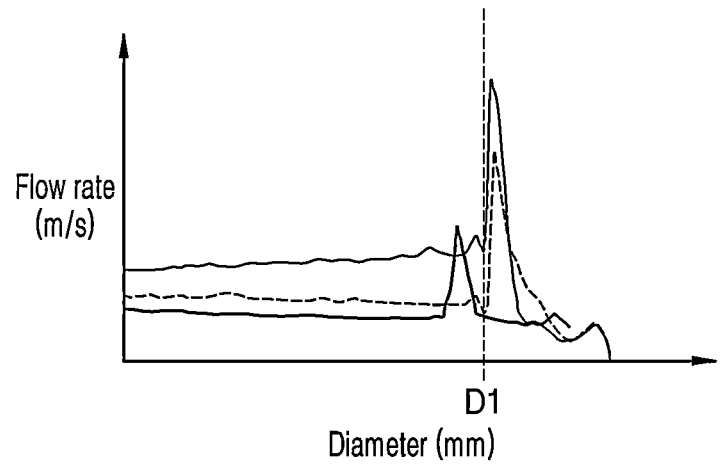
FIG. 17 is a graph illustrating an effect of a substrate processing apparatus according to an example embodiment of the inventive concept.

FIG. 17 is a graph illustrating a flow of a processing fluid in a substrate processing apparatus according to an example embodiment of the inventive concept.

Referring to FIG. 17, the horizontal axis of the graph represents a distance (unit: mm) from the center of the substrate W, and the vertical axis represents a flow rate (unit: m/s) of the processing fluid PF. A thin solid line represents a substrate processing apparatus according to a comparative example having a structure in which a second shower head is in contact with an upper surface of a processing container, and a thick solid line represents a substrate processing apparatus using the first shower head 410 of FIGS. 9A and 9B according to aspects of the inventive concept, and an alternated long and short dash line represents a substrate processing apparatus using a first shower head 410A according to aspects of the inventive concept.

A peak point at which a flow rate rapidly increases appears at a location away, by about D1, from the center on the substrate W, but a peak point of the alternated long and short dash line is lower than the thin solid line. In addition, the peak point of the alternated long and short dash line is higher than a peak point of the thick solid line. Accordingly, it can be seen that the substrate processing apparatus according to aspects the inventive concept has a relatively constant flow rate of the processing fluid on the side of the substrate W compared to the substrate processing apparatus of the comparative example.

Figure 18:
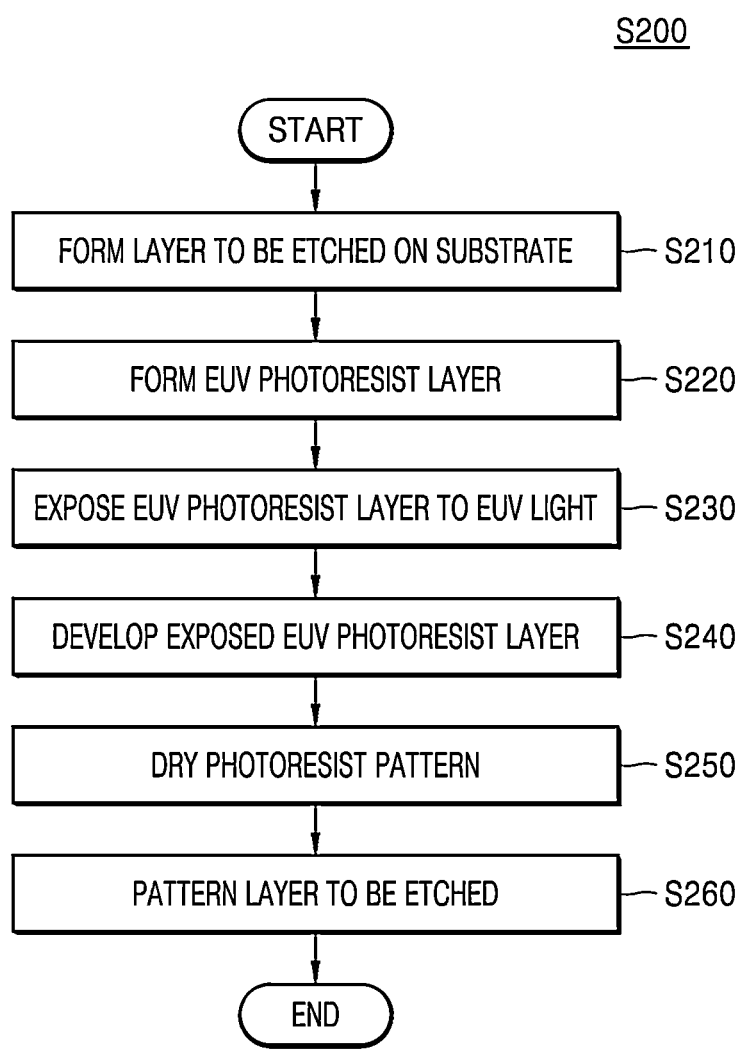
FIG. 18 is a flowchart illustrating a method of forming a fine pattern by using a substrate processing apparatus, according to an embodiment of the inventive concept.

FIG. 18 is a flowchart illustrating a method of forming a fine pattern by using a substrate processing apparatus, according to an embodiment of the inventive concept.

Referring to FIG. 18, the method of forming a fine pattern (S200) may include a process sequence of first to sixth operations (S210 to S260).

When an embodiment may be otherwise implemented, a certain process sequence may be performed differently from the sequence to be described. For example, two processes to be continuously described may be performed substantially simultaneously or may be performed in an order reverse to the order to be described.

The method S200 of forming a fine pattern according to aspects of the inventive concept may include the first operation S210 of forming, on a substrate, a layer to be etched, the second operation S220 of forming an EUV photoresist layer, the third operation S230 of exposing the EUV photoresist layer to EUV light, the fourth operation S240 of developing the exposed EUV photoresist layer, the fifth operation S250 of drying the photoresist pattern, and the sixth operation S260 of patterning the layer to be etched.

The technical characteristics of each of the first to sixth operations S210 to S260 are described in detail with reference to FIGS. 19A to 19H below.

FIGS. 19A to 19H are cross-sectional views illustrating the method of forming the fine pattern illustrated in FIG. 18 according to a process sequence.

Figure 19A:
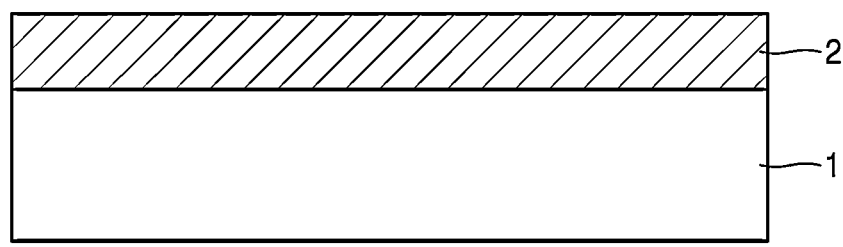
FIGS. 19A to 19H are cross-sectional views illustrating the method of forming the fine pattern of FIG. 18 according to a process sequence.
Figure 19A:
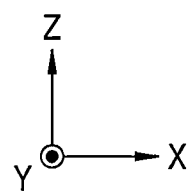

Referring to FIG. 19A, a layer 2 to be etched may be formed on a substrate 1.

Hereinafter, the substrate 1 may correspond to the substrate W described with reference to FIGS. 1 to 13. The substrate 1 may be, for example, a silicon (Si) wafer including crystalline silicon, polycrystalline silicon, or amorphous silicon. Alternatively, the substrate 1 may include a semiconductor element, such as germanium (Ge), or a compound semiconductor, such as silicon carbide (SiC), gallium arsenide (GaAs), indium arsenide (InAs), or indium phosphide (InP).

In addition, the substrate 1 may have a silicon on insulator (SOI) structure. For example, the substrate 1 may include a buried oxide (BOX) layer. In some embodiments, the substrate 1 may include a well doped with an impurity as a conductive region or a structure doped with an impurity. In addition, the substrate 1 may have various device isolation structures, such as a shallow trench isolation (STI) structure.

Semiconductor devices, such as transistors and diodes, may be formed in the substrate 1. In addition, a plurality of wires may be arranged in multiple layers in the substrate 1 and may be electrically separated by an interlayer insulating layer.

The layer 2 to be etched may be a conductive layer, a dielectric layer, an insulating layer, or a combination thereof. For example, the layer 2 to be etched may be formed of a metal, an alloy, metal carbide, metal nitride, metal oxynitride, metal oxycarbide, a semiconductor material, polysilicon, silicon oxide, silicon nitride, silicon oxynitride, or a combination thereof, but is not limited thereto.

Figure 19B:
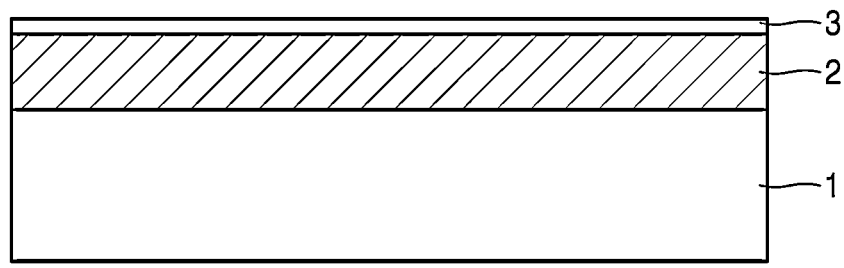
Figure 19B:
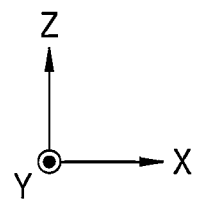

Referring to FIG. 19B, an anti-reflection layer 3 may be formed on the layer 2 to be etched.

The anti-reflection layer 3 may prevent total reflection of EUV light during a subsequent exposure process. The anti-reflection layer 3 may include an organic component having a light absorption structure and a solvent for dispersing the organic component. The light absorption structure may be, for example, a hydrocarbon compound having one or more benzene rings or a structure in which benzene rings are fused.

The anti-reflection layer 3 may be formed by, for example, a spin coating process, but is not limited thereto.

Figure 19C:
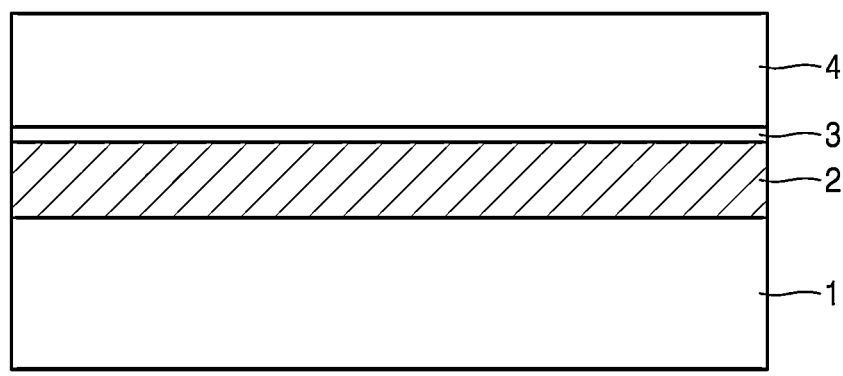

Referring to FIG. 19C, a EUV photoresist layer 4 may be formed on the anti-reflection layer 3.

The EUV photoresist layer 4 may be formed by a process, such as spin coating, spray coating, or dip coating. The EUV photoresist layer 4 may be formed to have a thickness of, for example, about 30 nm to about 150 nm. After the EUV photoresist layer 4 is formed, a soft baking process may be performed on the EUV photoresist layer 4 at a temperature of about 80° C. to about 220° C. for about 40 seconds to about 210 seconds.

Figure 19D:
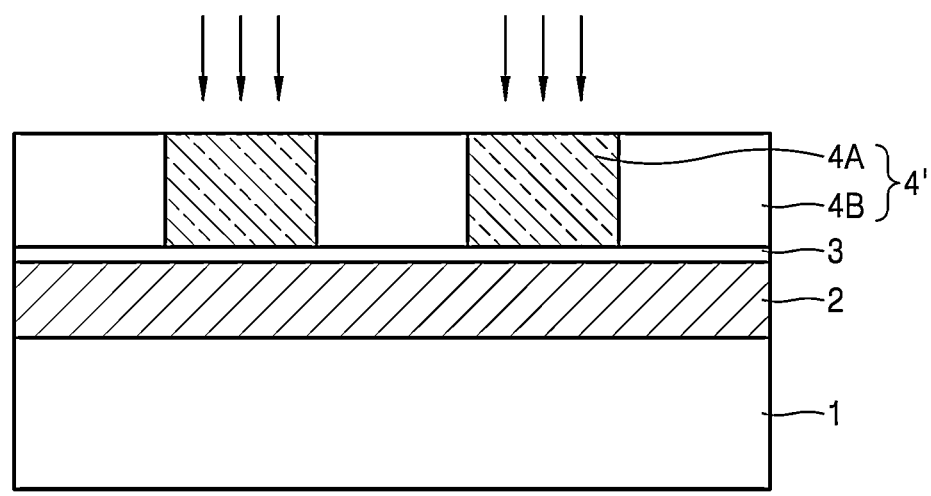

Referring to FIGS. 19C and 19D, the EUV photoresist layer 4 may be exposed by an EUV exposure apparatus (not illustrated).

Depending on the type of photoresist, the exposed portion may be removed by development, or the unexposed portion may be removed by development. Here, a case where the unexposed portion is removed later by a negative tone developer (NTD) is described. A person skilled in the art will understand that the same method may be applied to a case where the exposed portion is removed later by a positive tone developer (PTD).

An exposed EUV photoresist layer 4' may be divided into an exposed portion 4A and an unexposed portion 4B. In the exposed portion 4A, EUV light generates acid from a photoacid generator included in the exposed EUV photoresist layer 4', and accordingly, a photosensitive polymer is deprotected. The EUV light is not emitted to the unexposed portion 4B, and thus, the chemical reaction does not occur.

Figure 19E:
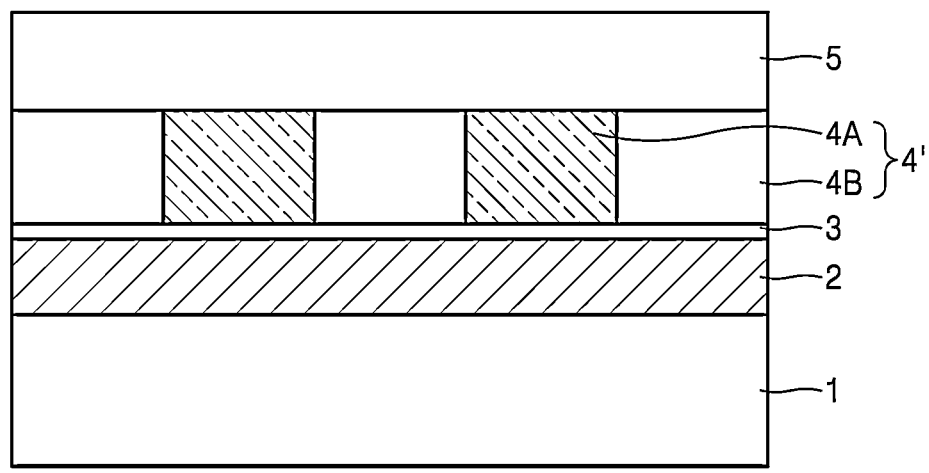
Figure 19E:
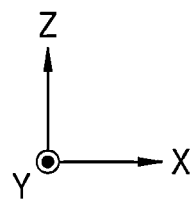

Referring to FIG. 19E, the exposed EUV photoresist layer 4' may be developed.

The exposed EUV photoresist layer 4' may be developed by using a developer, such as a non-polar organic solvent. A developer layer 5 may be formed on the exposed EUV photoresist layer 4' to develop the exposed EUV photoresist layer 4'. Because the developer of the developer layer 5 has good miscibility with polymers that are not exposed to EUV light and retain protective groups, the unexposed portion is dissolved in the developer layer 5. In addition, because a portion exposed to EUV light is deprotected, miscibility with a developer is relatively poor.

Figure 19F:
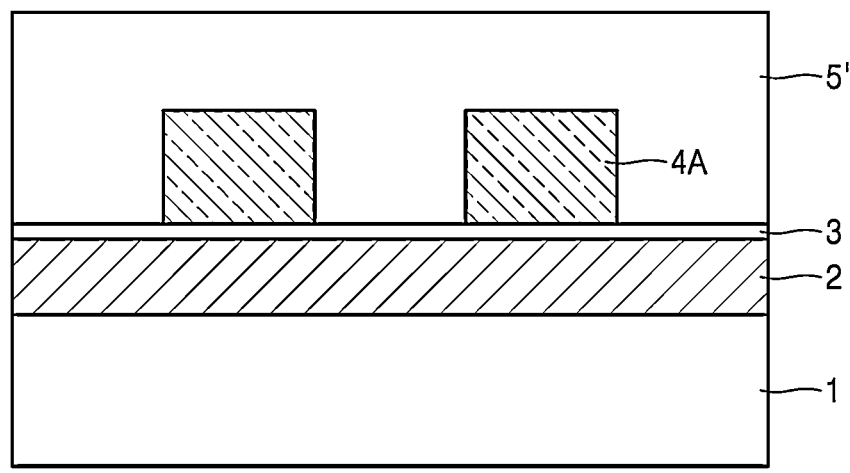

Referring to FIG. 19F, a mixed developer layer 5' may be obtained by dissolving the unexposed portion 4B.

The exposed portion 4A is not dissolved in the developer of the mixed developer layer 5', and accordingly, the exposed portion 4A may remain in an original state. The exposed portion 4A may be surrounded by the mixed developer layer 5'.

Figure 19G:
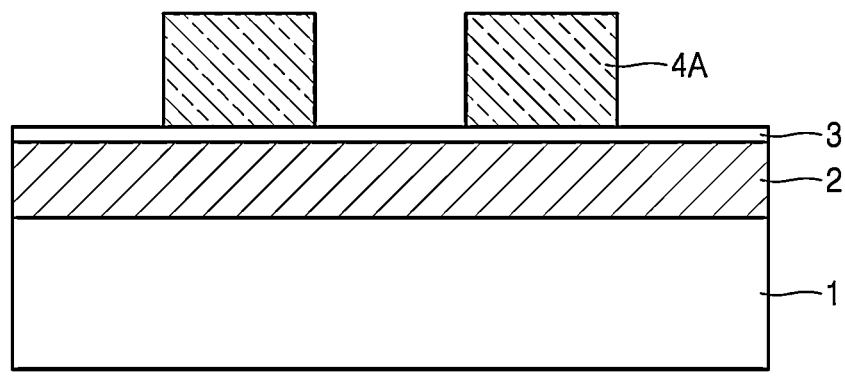
Figure 19G:
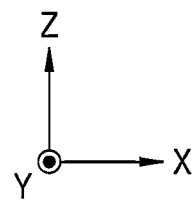

Referring to FIGS. 19F and 19G, the exposed portion 4A may be exposed by removing the mixed developer layer 5'. In example embodiments, the substrate drying method S100 described above with reference to FIG. 5 may be performed to remove the mixed developer layer 5'.

In some embodiments, a baking process may be performed on the exposed portion 4A. Baking of the exposed portion 4A may be performed at a temperature of about 213° C. to about 170° C. for about 30 seconds to about 213 seconds, but is not limited thereto.

Figure 19H:
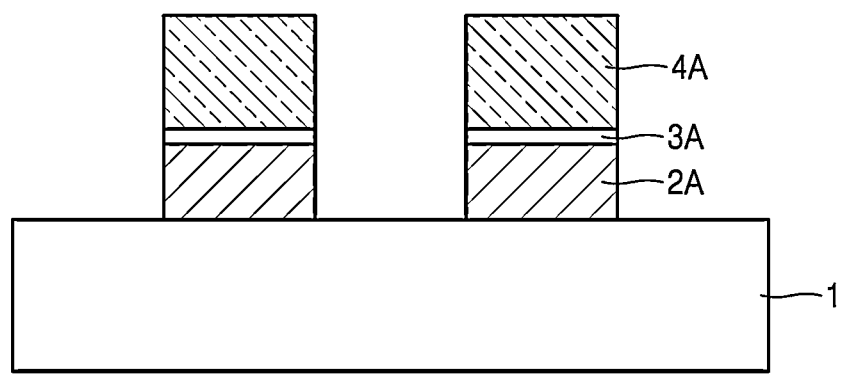
Figure 19H:
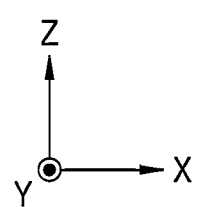

Referring to FIGS. 19G and 19H, a fine pattern 2A may be formed by patterning the layer 2 to be etched by anisotropic etching by using the exposed portion 4A as an etching mask.

The layer 2 to be etched may be patterned by processes, such as plasma etching, reactive ion etching (RIE), and ion beam etching. The anti-reflection layer 3 may be removed leaving a remaining portion 3A.

The exposed portion 4A and the remaining portion 3A on the fine pattern 2A may be removed to expose the fine pattern 2A. The fine pattern 2A may have a width of about 5 nm to about 20 nm. In some embodiments, the fine pattern 2A may have a width of about 3 nm to about 20 nm, but is not limited thereto.

The fine pattern 2A may constitute various elements necessary for implementing an integrated circuit device. For example, the fine pattern 2A may be an active region defined on the substrate 1 of the semiconductor device. Alternatively, the fine pattern 2A may include a plurality of contact hole patterns or line and space patterns.

The fine pattern 2A may include a conductive pattern or an insulating pattern. For example, the conductive pattern may constitute a pattern for forming a bit line in a cell array region of an integrated circuit device, a pattern for forming a direct contact, a pattern for forming a buried contact, a pattern for forming a lower electrode of a capacitor, or a conductive pattern in a core region of an integrated circuit device.

While aspects of the inventive concept have been particularly shown and described with reference to embodiments thereof, it will be understood that various changes in form and details may be made therein without departing from the spirit and scope of the following claims.

What is claimed is:

1. A substrate processing apparatus comprising:
a processing container including a processing space;
a substrate support extending in a first direction and a second direction perpendicular to the first direction, and configured to support a substrate in the processing container;
a fluid supply device configured to supply a processing fluid in a supercritical state to the processing space through a container supply pipe; and
a shower head assembly configured to diffuse the processing fluid supplied from the fluid supply device into the processing space,
wherein the shower head assembly comprises:
a first shower head having a first diameter; and
a second shower head arranged between the first shower head and the substrate and having a second diameter, and
wherein the processing container is detached from the shower head assembly and separated from the shower head assembly in a third direction perpendicular to the first direction and the second direction, such that a flow path is formed directly between the processing container and the second shower head.

2. The substrate processing apparatus of claim 1, wherein the first diameter of the first shower head is less than the second diameter of the second shower head.

3. The substrate processing apparatus of claim 1, wherein the first shower head comprises:
a first plate having a first hole;
a second plate having a second hole;
a third plate having a third hole; and
a fourth plate having a fourth hole, and
the first plate to the fourth plate are sequentially stacked in the third direction.

4. The substrate processing apparatus of claim 3, wherein a central axis of the first hole of the first plate is aligned with a central axis of the third hole of the third plate in the third direction, and
a central axis of the second hole of the second plate is aligned with a central axis of the fourth hole of the fourth plate in the third direction.

5. The substrate processing apparatus of claim 4, wherein the central axis of the first hole is separated from the central axis of the second hole in the first direction.

6. The substrate processing apparatus of claim 1, wherein the second diameter of the second shower head is greater than or equal to a diameter of the substrate.

7. The substrate processing apparatus of claim 1, wherein the first shower head includes a plurality of holes that form a triply periodic minimal surface (TPMS) shape.

8. The substrate processing apparatus of claim 7, wherein the plurality of holes are aligned with one another in the third direction.

9. The substrate processing apparatus of claim 7, wherein the TPMS shape of the plurality of holes is any one of a P-surface, a D-surface, and an H-surface.

10. The substrate processing apparatus of claim 1, wherein the processing fluid includes carbon dioxide.

11. The substrate processing apparatus of claim 1, wherein a portion of the flow path is defined by a buffer space formed directly between a lower surface of the first shower head and an upper surface of the second shower head and formed directly between an inner wall of the processing container and the upper surface of the second shower head.

12. The substrate processing apparatus of claim 11, wherein the inner wall of the processing container includes an inclined surface inclined with a vertical level that is reduced along a direction extending along the upper surface of the second shower head.

13. The substrate processing apparatus of claim 11, wherein the lower surface of the first shower head and the upper surface of the processing container are disposed at the same level in the third direction.

14. A substrate processing apparatus comprising:
a processing container including a processing space;
a substrate support extending in a first direction and a second direction perpendicular to the first direction, and configured to support a substrate in the processing container;
a fluid supply device configured to supply a processing fluid in a supercritical state to the processing space through a container supply pipe;
a shower head assembly configured to diffuse the processing fluid supplied from the fluid supply device into the processing space;
an exhaust pipe arranged on a lower wall of the processing container; and
an exhaust device configured to discharge a fluid in the processing space through the exhaust pipe;
wherein the shower head assembly comprises:
a first shower head having a first diameter; and
a second shower head arranged under the first shower head and having a second diameter that is greater than the first diameter, and
wherein the processing container is detached from the shower head assembly and separated from the shower head assembly in a third direction perpendicular to the first direction and the second direction to form an inclined flow path directly between the shower head assembly and the processing container.

15. The substrate processing apparatus of claim 14, wherein the inclined flow path reduces pressure of the processing fluid between the first shower head and the second shower head.

16. The substrate processing apparatus of claim 14, wherein a separation space is formed between the shower head assembly and the processing container, and
an upper surface of the separation space has a conical shape having an inclination with respect to the shower head assembly.

17. The substrate processing apparatus of claim 14, wherein centers of the first shower head, the second shower head, and of the substrate are aligned with one another along a central axis of the processing container.

18. The substrate processing apparatus of claim 14, further comprising:
a plurality of supply pipes connecting the fluid supply device to the processing container,
wherein the plurality of supply pipes include at least three supply pipes, and
inner diameters of the plurality of supply pipes are different from each other.

19. The substrate processing apparatus of claim 14, wherein the inclined flow path is formed directly between an upper surface of the second shower head of the shower head assembly and an inner wall of the processing container.

20. The substrate processing apparatus of claim 19, wherein a lower surface of the first shower head is disposed at a level in the third direction that is the same as or higher than the inner wall of the processing container.

* * * * *